US012626735B2

(12) United States Patent
Tabata

(10) Patent No.: US 12,626,735 B2
(45) Date of Patent: May 12, 2026

(54) SEMICONDUCTOR MEMORY DEVICE WITH VOLTAGE-CONTROLLED DATA LATCH NODE

(71) Applicant: Kioxia Corporation, Tokyo (JP)

(72) Inventor: Koji Tabata, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 31 days.

(21) Appl. No.: 18/589,303

(22) Filed: Feb. 27, 2024

(65) Prior Publication Data

US 2024/0321326 A1 Sep. 26, 2024

(30) Foreign Application Priority Data

Mar. 23, 2023 (JP) ................................. 2023-046722

(51) Int. Cl.
*G11C 7/10* (2006.01)
*G11C 7/08* (2006.01)

(52) U.S. Cl.
CPC .............. *G11C 7/08* (2013.01); *G11C 7/1039* (2013.01); *G11C 7/1087* (2013.01); *G11C 7/109* (2013.01)

(58) Field of Classification Search
CPC .................................................... G11C 7/1087
See application file for complete search history.

(56) References Cited

U.S. PATENT DOCUMENTS

| | | | | |
|---|---|---|---|---|
| 2017/0110164 A1* | 4/2017 | Cheng | ..................... | G11C 7/10 |
| 2018/0054190 A1 | 2/2018 | Takagiwa | | |
| 2023/0087689 A1* | 3/2023 | Satoh | ..................... | G11C 16/26 |
| | | | | 365/185.21 |
| 2023/0282257 A1* | 9/2023 | Kurosawa | .............. | G11C 16/26 |
| | | | | 365/233.1 |

FOREIGN PATENT DOCUMENTS

JP 2018-029301 A 2/2018

* cited by examiner

*Primary Examiner* — Hoai V Ho
(74) *Attorney, Agent, or Firm* — Kim & Stewart LLP

(57) ABSTRACT

A semiconductor memory device includes a sense amplifier provided between a memory cell array and an input/output circuit. The sense amplifier has a data latch circuit operating at a first operating voltage and having first and second nodes, a multiplexer operating at a second operating voltage, and a sense amplifier unit. The first node is connected to the multiplexer and latches a first voltage supplied from the multiplexer in accordance with data to be latched. The second node is connected to the sense amplifier unit and latches a second voltage having a voltage level that is inverted from that of the first voltage. A high-level of the first voltage latched in the first node is at a voltage level of the second operating voltage at a time the first voltage is supplied from the multiplexer and transitions to a voltage level of the first operating voltage thereafter.

20 Claims, 17 Drawing Sheets

*FIG. 3*

INPUT COMMAND SET
OF WRITE OPERATION

/CE

/WE

ALE

CLE

/RE

DQS

DQ    80h    10h    70h    STT

R/B

T0    T1    T2 t ADL
300nsec tProg

SENSE AMPLIFIER

SENSE AMPLIFIER UNIT — 50

DATA LATCH CIRCUIT — XDL

MULTIPLEXER UNIT — 60

FIG. 11A    IOBUS

FIG. 11B    DIN_N

FIG. 11C    DIN_P

FIG. 11D    DIN_N

FIG. 11E    DIN_P

FIG. 11F    XBUS

FIG. 11G    XTL

FIG. 11H    XNL

FIG. 11I    XLL

FIG. 11J    LAT20

FIG. 11K    INV20

FIG. 14A  IOBUS

FIG. 14B  DIN_N

FIG. 14C  DIN_P

FIG. 14D  DIN_N

FIG. 14E  DIN_P

FIG. 14F  XBUS

FIG. 14G  XTL

FIG. 14H  XNL

FIG. 14I  XLL

FIG. 14J  LAT20

FIG. 14K  INV20

FIG. 15A VDDREADn_Q

FIG. 15D IOBUS

SEMICONDUCTOR MEMORY DEVICE WITH VOLTAGE-CONTROLLED DATA LATCH NODE

CROSS-REFERENCE TO RELATED APPLICATION(S)

This application is based upon and claims the benefit of priority from Japanese Patent Application No. 2023-046722, filed Mar. 23, 2023, the entire contents of which are incorporated herein by reference.

FIELD

Embodiments described herein relate generally to a semiconductor memory device.

BACKGROUND

A NAND-type flash memory is known as one type of semiconductor memory device.

DESCRIPTION OF THE DRAWINGS

FIG. 3 is a timing chart showing an operation example of the semiconductor memory device of the first embodiment at the time of data writing.

FIG. 6 is a block diagram showing a configuration of a sense amplifier of the first embodiment.

DETAILED DESCRIPTION

Figure 1:
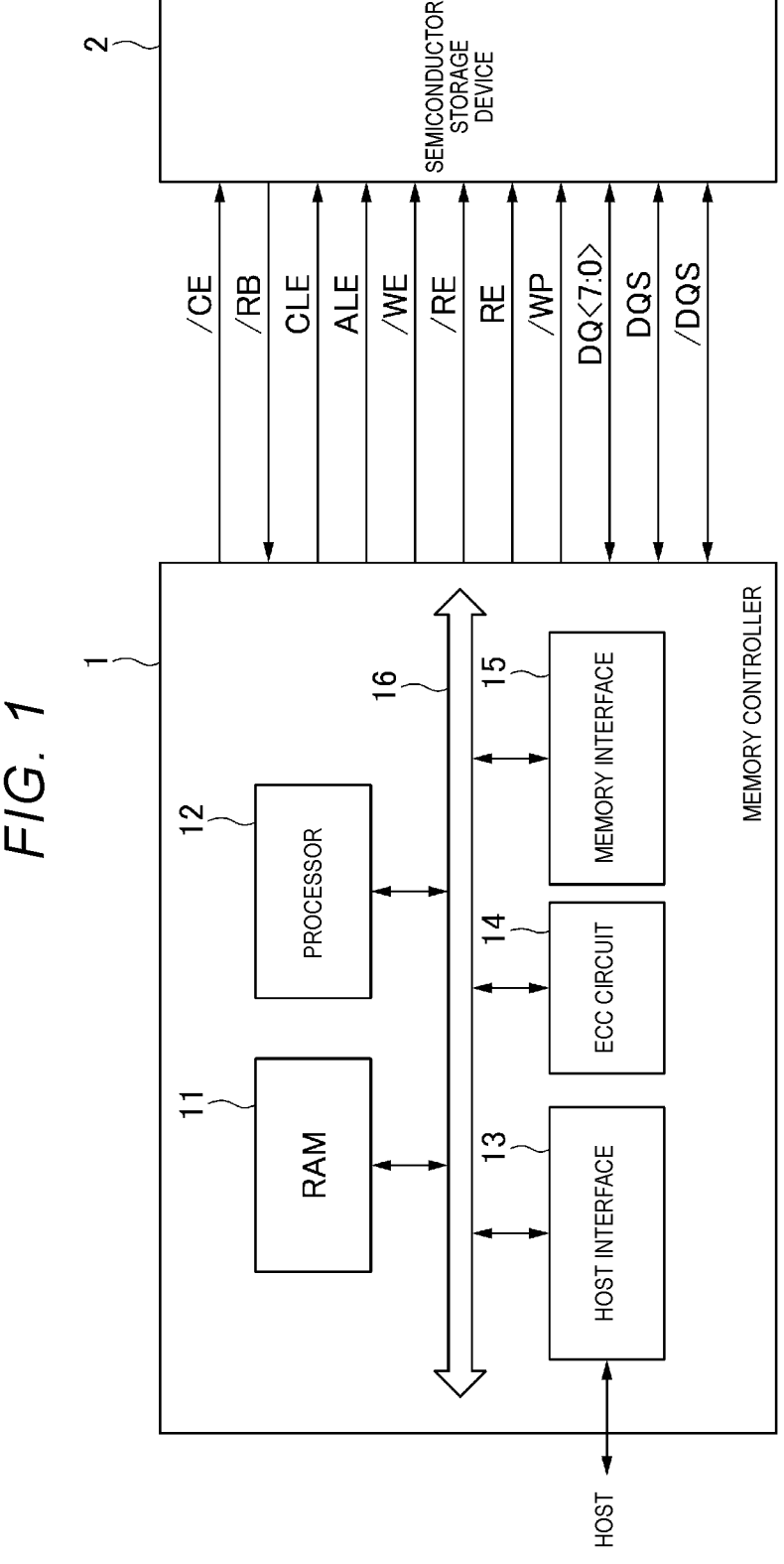
FIG. 1 is a block diagram showing a schematic configuration of a memory system of a first embodiment.

Embodiments provide a semiconductor memory device capable of reducing power consumption.

In general, according to one embodiment, the semiconductor memory device includes a memory cell array including a plurality of memory cell transistors, and a sense amplifier provided between the memory cell array and an input/output circuit. The sense amplifier has a data latch circuit, a multiplexer unit, and a sense amplifier unit. The data latch circuit is configured to operate at a first operating voltage and to latch data written to the memory cell transistor and data read from the memory cell transistor. The multiplexer unit is configured to operate at a second operating voltage different from the first operating voltage and provided between the input/output circuit and the data latch circuit. The sense amplifier unit is configured to latch data read from the memory cell transistors at a time of reading in the data latch circuit and latches the data in the data latch circuit, and to store the data latched in the data latch circuit in the memory cell transistors at a time of writing. The data latch circuit has a first node and a second node. The first node is connected to the multiplexer unit and latches a first voltage supplied from the multiplexer unit via a signal line in accordance with data to be latched in the data latch circuit. The second node is connected to the sense amplifier unit and latches a second voltage having a voltage level that is inverted from that of the first voltage. A high-level of the first voltage latched in the first node is at a voltage level of the second operating voltage at a time the first voltage is supplied from the multiplexer unit via the signal line and transitions to a voltage level of the first operating voltage thereafter Hereinafter, embodiments will be described with reference to drawings. In order to facilitate understanding of the description, the same elements are designated by the same reference numerals as much as possible in each drawing, and description thereof is not repeated.

1. First Embodiment

A semiconductor memory device of a first embodiment will be described. A semiconductor memory device according to the present embodiment is a non-volatile memory device configured as a NAND-type flash memory.

1.1 Configuration of Memory System

As shown in FIG. 1, the memory system of the present embodiment includes a memory controller 1 and a semiconductor memory device 2. The semiconductor memory device 2 is a non-volatile memory device configured as a NAND-type flash memory. The memory system may be connected to a host. The host is, for example, an electronic device such as a personal computer or a mobile terminal. Only one semiconductor memory device 2 is shown in FIG. 1, but a plurality of semiconductor memory devices 2 may be provided in an actual memory system.

The memory controller 1 controls writing of data to the semiconductor memory device 2 according to a write request from the host. Further, the memory controller 1 controls reading of data from the semiconductor memory device 2 according to a read request from the host. Between the memory controller 1 and the semiconductor memory device 2, signals including a chip enable signal/CE, a ready busy signal/RB, a command latch enable signal CLE, an address latch enable signal ALE, a write enable signal/WE, read enable signals RE and/RE, a write protect signal/WP, a data signal DQ<7:0>, data strobe signals DQS and/DQS are communicated.

The chip enable signal/CE is a signal for enabling the semiconductor memory device 2. The ready busy signal/RB is a signal for indicating whether the semiconductor memory device 2 is in a ready state or a busy state. The "ready state" is a state in which an external command can be received. The "busy state" is a state in which an external command cannot be received. The command latch enable signal CLE is a signal indicating that the signals DQ<7:0> are commands. The address latch enable signal ALE is a signal indicating that the signals DQ<7:0> are addresses. The write enable signal/WE is a signal for taking the received signal in the semiconductor memory device 2 and is asserted each time the memory controller 1 receives a command, an address, and data. The memory controller 1 instructs the semiconductor memory device 2 to receive the signal DQ<7:0> while the signal/WE is at an "L (Low)" level.

The read enable signals RE and/RE are signals for the memory controller 1 to read data from the semiconductor memory device 2. The read enable signals RE and/RE are used, for example, to control the operation timing of the semiconductor memory device 2 when outputting the signal DQ<7: 0>. The write protect signal/WP is a signal for instructing the semiconductor memory device 2 to inhibit data writing and erasing. The signals DQ<7:0> contain data exchanged between the semiconductor memory device 2 and the memory controller 1, and include commands, addresses, and data. The data strobe signals DQS and/DQS are signals for controlling the input/output timing of the signal DQ<7: 0>.

The memory controller 1 includes a RAM 11, a processor 12, a host interface 13, an ECC circuit 14, and a memory interface 15. These are connected to each other by an internal bus 16. The host interface 13 outputs the request received from the host, user data (e.g., write data), and the like to the internal bus 16. Further, the host interface 13 transmits the user data read from the semiconductor memory device 2, the response from the processor 12, and the like to the host.

The memory interface 15 controls a process of writing user data and the like to the semiconductor memory device 2 and a process of reading the user data from the semiconductor memory device 2 based on the instruction of the processor 12. The processor 12 controls the memory controller 1 in an integrated manner. The processor 12 is a CPU, an MPU, or the like. When receiving a request from the host via the host interface 13, the processor 12 controls the memory controller 1 in response to the request. For example, the processor 12 instructs the memory interface 15 to write the user data and a parity to the semiconductor memory device 2 according to the request from the host. Further, the processor 12 instructs the memory interface 15 to read the user data and the parity from the semiconductor memory device 2 according to the request from the host.

The processor 12 determines a storage area (a memory area) on the semiconductor memory device 2 with respect to the user data stored in the RAM 11. The user data is stored in the RAM 11 via the internal bus 16. The processor 12 performs determination of the memory area with respect to data in units of a page (page data), which is the unit of writing. The user data, which is stored in one page of the semiconductor memory device 2, is hereinafter also referred to as "unit data". The unit data is generally encoded and is stored in the semiconductor memory device 2 as a codeword. The encoding is optional in the present embodiment.

The memory controller 1 may store the unit data in the semiconductor memory device 2 without encoding, and FIG. 1 shows a configuration in which encoding is performed as an example. When the memory controller 1 does not perform encoding, the page data will match the unit data. Further, one codeword may be generated based on one unit data, or one codeword may be generated based on divided data obtained by dividing unit data. Also, one codeword may be generated using a plurality of pieces of unit data.

The processor 12 determines the memory area of the semiconductor memory device 2 to be written for each unit data. A physical address is assigned to the memory areas of the semiconductor memory device 2. The processor 12 manages the memory area to which unit data is written using physical addresses. The processor 12 specifies the determined memory area (which is the physical address) and instructs the memory interface 15 to write user data to the semiconductor memory device 2. The processor 12 manages correspondence between logical addresses of user data (logical addresses managed by the host) and physical addresses. When receiving a read request including a logical address from the host, the processor 12 identifies the physical address corresponding to the logical address, specifies the physical address, and instructs the memory interface 15 to read user data.

The ECC circuit 14 encodes the user data stored in the RAM 11 to generate a codeword. Further, the ECC circuit 14 decodes the codeword read from the semiconductor memory device 2. The RAM 11 temporarily stores the user data received from the host until the user data is stored in the semiconductor memory device 2, or temporarily stores the data read from the semiconductor memory device 2 until the user data is transmitted to the host. The RAM 11 is a general-purpose memory such as an SRAM or a DRAM.

FIG. 1 shows a configuration example in which the memory controller 1 includes the ECC circuit 14 and the memory interface 15, respectively. Meanwhile, the ECC circuit 14 may be built in the memory interface 15. Further, the ECC circuit 14 may be built in the semiconductor memory device 2. The configuration and arrangement of each element shown in FIG. 1 are not limited to the specific configuration and arrangement shown in FIG. 1.

When a write request is received from the host, the memory system in FIG. 1 operates as follows. The processor 12 temporarily stores the data to be written in the RAM 11. The processor 12 reads out the data stored in the RAM 11 and inputs the read data to the ECC circuit 14. The ECC circuit 14 encodes the input data and inputs the codeword to the memory interface 15. The memory interface 15 writes the input codeword to the semiconductor memory device 2.

When a read request is received from the host, the memory system in FIG. 1 operates as follows. The memory interface 15 inputs the codeword read from the semiconductor memory device 2 to the ECC circuit 14. The ECC circuit 14 decodes the input codeword and stores the decoded data in the RAM 11. The processor 12 transmits the data stored in the RAM 11 to the host via the host interface 13.

1.2 Schematic Configuration of Semiconductor Memory Device

Figure 2:
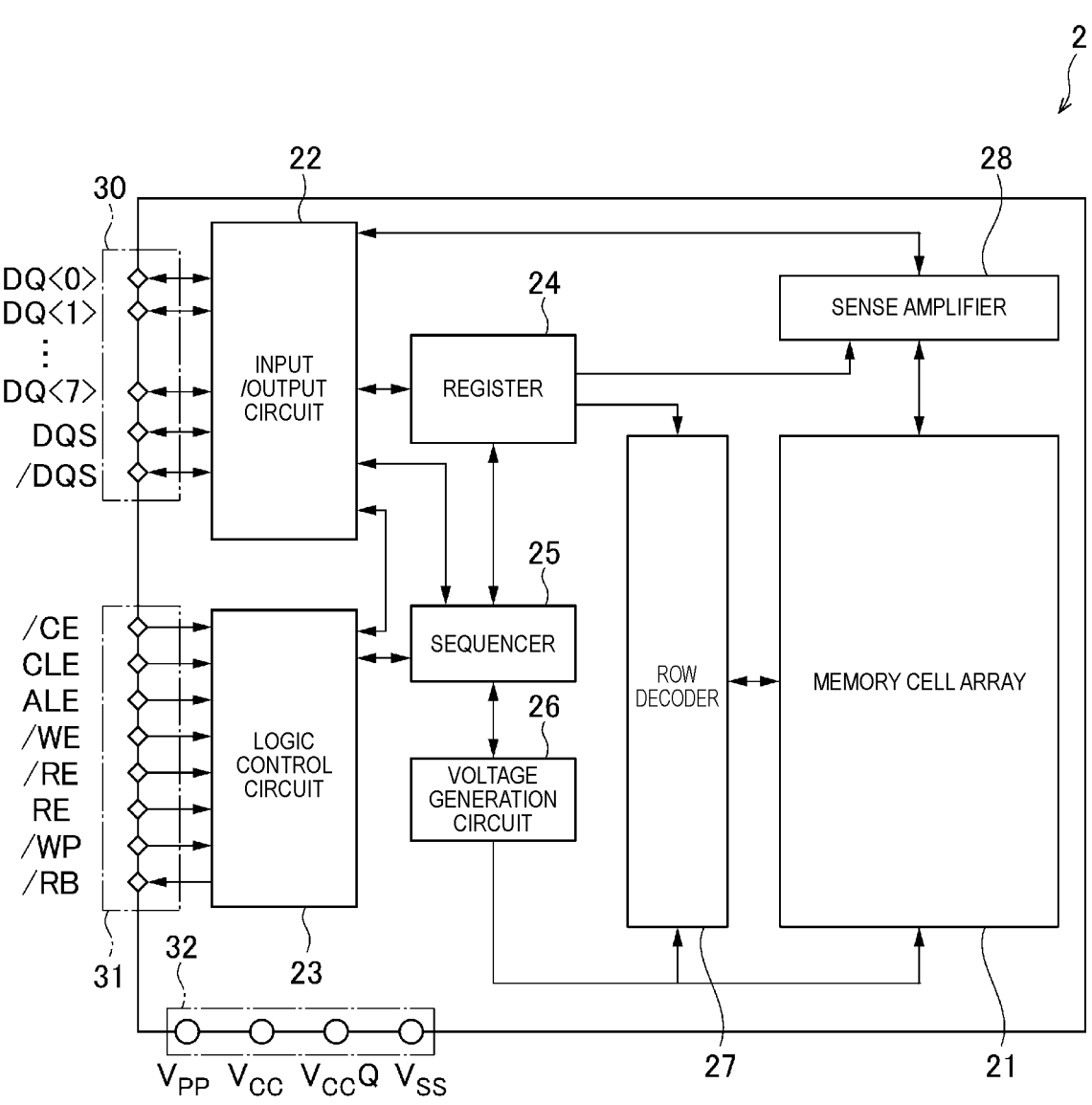
FIG. 2 is a block diagram showing a schematic configuration of a semiconductor memory device of a first embodiment.

As shown in FIG. 2, the semiconductor memory device 2 includes a memory cell array 21, an input/output circuit 22, a logic control circuit 23, a register 24, a sequencer 25, a voltage generation circuit 26, a row decoder 27, a sense amplifier 28, an input/output pad group 30, a logic control pad group 31, and a power input terminal group 32.

The memory cell array 21 is a portion of the semiconductor memory device 2 for storing data. The memory cell array 21 is configured to have a plurality of memory cell transistors associated with a plurality of bit lines and a plurality of word lines. The input/output circuit 22 exchanges the signal DQ<7: 0> and the data strobe signals DQS and/DQS with the memory controller 1. Further, the input/output circuit 22 transfers a command and an address in the signal DQ<7: 0> to the register 24. Further, the input/output circuit 22 exchanges write data and read data with the sense amplifier 28.

The logic control circuit 23 receives the chip enable signal/CE, the command latch enable signal CLE, the address latch enable signal ALE, the write enable signal/ WE, the read enable signals RE and/RE, and the write protect signal/WP from the memory controller 1. Further, the logic control circuit 23 transfers the ready/busy signal/ RB to the memory controller 1 to transmit the state of the semiconductor memory device 2 to the outside.

The register 24 temporarily latches various data. For example, the register 24 latches commands for instructing a write operation, a read operation, an erasing operation, and the like. This command is input from the memory controller 1 to the input/output circuit 22, and then transferred from the input/output circuit 22 to the register 24 and is latched. The register 24 also latches the address corresponding to the above command. This address is input from the memory controller 1 to the input/output circuit 22, and then transferred from the input/output circuit 22 to the register 24 and is latched. Further, the register 24 also latches the state information indicating the operation state of the semiconductor memory device 2. The state information is updated by the sequencer 25 each time according to the operation state of the memory cell array 21 and the like. The state information is output from the input/output circuit 22 to the memory controller 1 as a state signal in response to the request from the memory controller 1.

The sequencer 25 controls the operation of each portion of the semiconductor memory device 2 including the memory cell array 21 based on the control signals input from the memory controller 1 to the input/output circuit 22 and the logic control circuit 23. In the present embodiment, the sequencer 25 corresponds to the control unit. More specifically, at least part of the sequencer 25 configured to generate a control signal VDDREADn_Q functions as the control unit. The voltage generation circuit 26 is a portion of the semiconductor memory device 2 that generates the voltage required for each of the data write operation, read operation, and erasing operation in the memory cell array 21. For example, a voltage applied to each of a plurality of word lines and a plurality of bit lines of the memory cell array 21, or the like is supplied by the voltage generation circuit 26. The operation of the voltage generation circuit 26 is controlled by the sequencer 25.

The row decoder 27 is a circuit configured with a group of switches for applying a voltage to each of a plurality of word lines of the memory cell array 21. The row decoder 27 receives a block address and a row address from the register 24, selects a block based on the block address, and selects a word line based on the row address. The row decoder 27 switches the open/closed state of the group of switches so that the voltage from the voltage generation circuit 26 is applied to the selected word line. The operation of the row decoder 27 is controlled by the sequencer 25.

The sense amplifier 28 is a circuit for adjusting the voltage applied to the bit line of the memory cell array 21 or sensing the voltage of the bit line and converting the sensed voltage into data. At the time of reading data, the sense amplifier 28 determines the data stored in the memory cell transistor of the memory cell array 21 based on the sensed voltage of the bit line, and transfers the read data to the input/output circuit 22. When writing data, the sense amplifier 28 sets the bit line to a voltage level that enables the memory cell transistor to be programmed with the write data. The operation of the sense amplifier 28 is controlled by the sequencer 25.

The input/output pad group 30 is a portion of the semiconductor memory device 2 provided with a plurality of terminals (pads) for exchanging each signal between the memory controller 1 and the input/output circuit 22. Each terminal is individually provided corresponding to each of the signal DQ<7: 0> and the data strobe signals DQS and/DQS.

The logic control pad group 31 is a portion of the semiconductor memory device 2 provided with a plurality of terminals for exchanging each signal between the memory controller 1 and the logic control circuit 23. Each terminal is individually provided corresponding to the chip enable signal/CE, the command latch enable signal CLE, the address latch enable signal ALE, the write enable signal/ WE, the read enable signal RE and/RE, the write protect signal/WP, and the ready busy signal/RB.

The power input terminal group 32 is a portion of the semiconductor memory device 2 provided with a plurality of terminals for receiving power supply voltages that are needed for the operation of the semiconductor memory device 2. The power supply voltages received through the terminals include power supply voltages Vcc, VccQ, Vpp, and a ground voltage Vss. The power supply voltage Vcc is a circuit power supply voltage supplied from the outside as an operation power supply, and is, for example, a voltage of about 2.5 V. The power supply voltage Vcc is, for example, a voltage for generating a voltage Vdd which is an internal power supply voltage of the semiconductor memory device 2. The power supply voltage Vdd is, for example, a voltage of about 1.5 V. In the semiconductor memory device 2, an area to which the internal power supply voltage Vdd is supplied may be referred to as a Vdd domain. The power supply voltage VccQ is a power supply voltage lower than the power supply voltage Vcc, and is, for example, a voltage of 1.2 V. The power supply voltage VccQ is an input/output power supply voltage used when exchanging signals between the memory controller 1 and the semiconductor memory device 2. In the semiconductor memory device 2, an area to which the input/output power supply voltage VccQ is supplied may be referred to as a VccQ domain. The power supply voltage VccQ is supplied to at least a driver circuit or a receiver circuit (not shown) of the input/output circuit 22. In other words, in the semiconductor memory device 2, at least the driver circuit or the receiver circuit of the input/output circuit 22 belongs to the VccQ domain. The power supply voltage Vpp is a power supply voltage higher than the power supply voltage Vcc, and is, for example, a voltage of 12 V.

1.3 Example of Data Input

Figure 3:
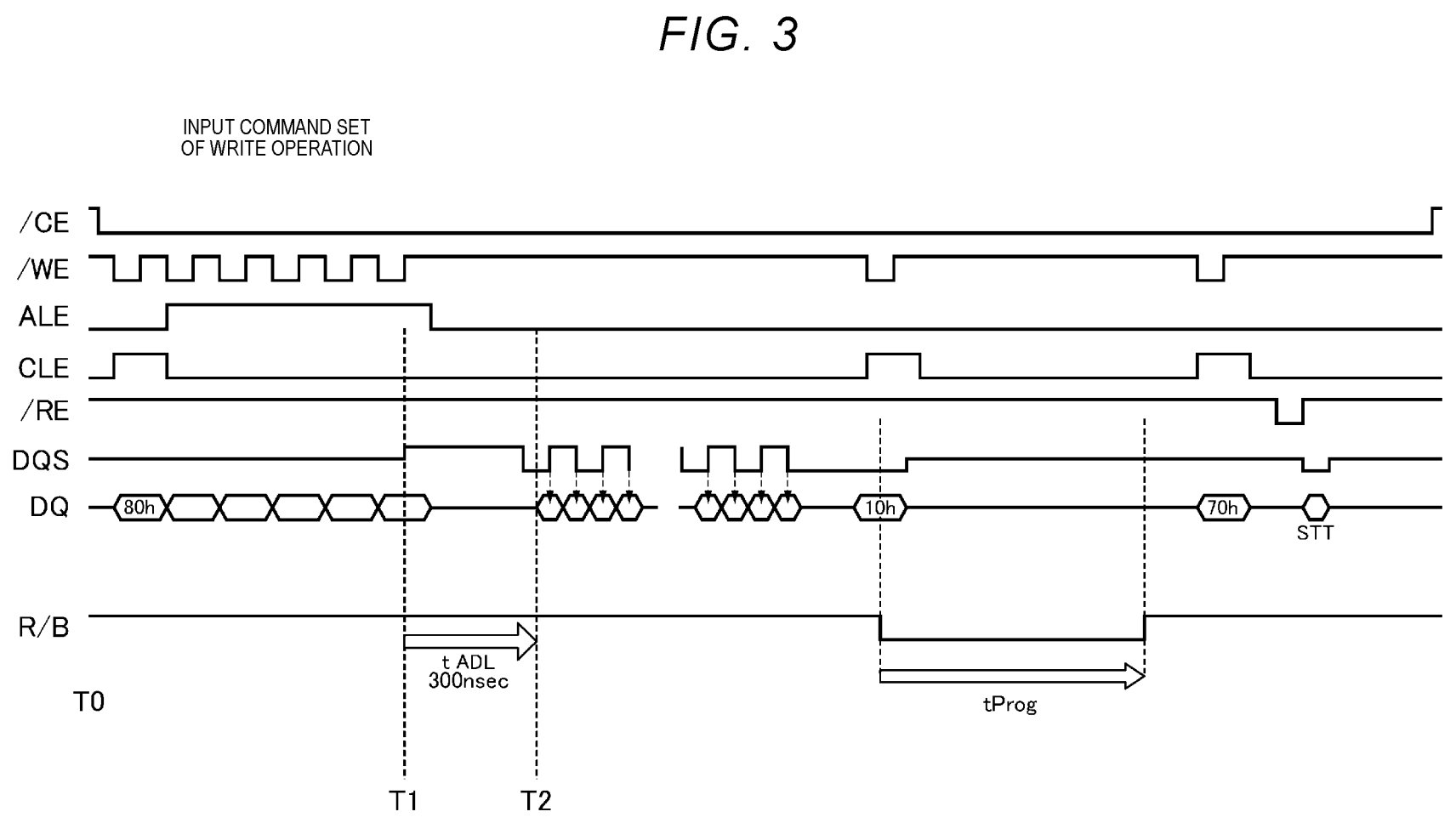

Next, an operation example of the semiconductor memory device 2 at the time of data writing will be described. As shown in FIG. 3, first, a command set for a write operation is input. Specifically, the memory controller 1, for example, sets the command latch enable signal CLE to a high level at time TO, and then transmits the command 80$h$ in the signal DQ<7:0>. More specifically, signals corresponding to a binary "10000000" (a hexadecimal "80") are input to the eight terminals corresponding to the signal DQ<7:0>, respectively. The command 80*h* is incorporated in response to the rising edge of the write enable signal/WE. Subsequently, the memory controller 1 sets the address latch enable signal ALE to a high level, and then transmits the address as the signal DQ<7:0>. The address is transmitted over a plurality of cycles (for example, five cycles). The address is incorporated in response to the rising edge of the write enable signal/WE. After a predetermined time tADL has elapsed from the time T1 at which the address transmission is completed to the time at which the acceptance preparation for the first 8-bit data is completed, that is, when the time T2 is reached, the memory controller 1 supplies the data in the signal DQ<7:0> while causing the data strobe signals DQS and/DQS to alternately transition between the low level and the high level. The predetermined time tADL is, for example, a time required until the acceptance preparation for the first 8-bit data is completed in the semiconductor memory device 2 after the address transmission is completed. Thereafter, the memory controller 1 sets the command latch enable signal CLE to a high level, and then transmits the command 10*h* in the signal DQ<7:0>. When the command 10*h* is incorporated in response to the rising edge of the write enable signal/WE, the internal operation such as the application of the program voltage or the verify voltage is performed during the period from that time point to the elapse of the internal operation time tProg. The amplitude of the signal DQ<7:0> and the data strobe signals DQS and/DQS is substantially equal to the power supply voltage VccQ.

1.4 Circuit Configuration of Memory Cell Array

Figure 4:
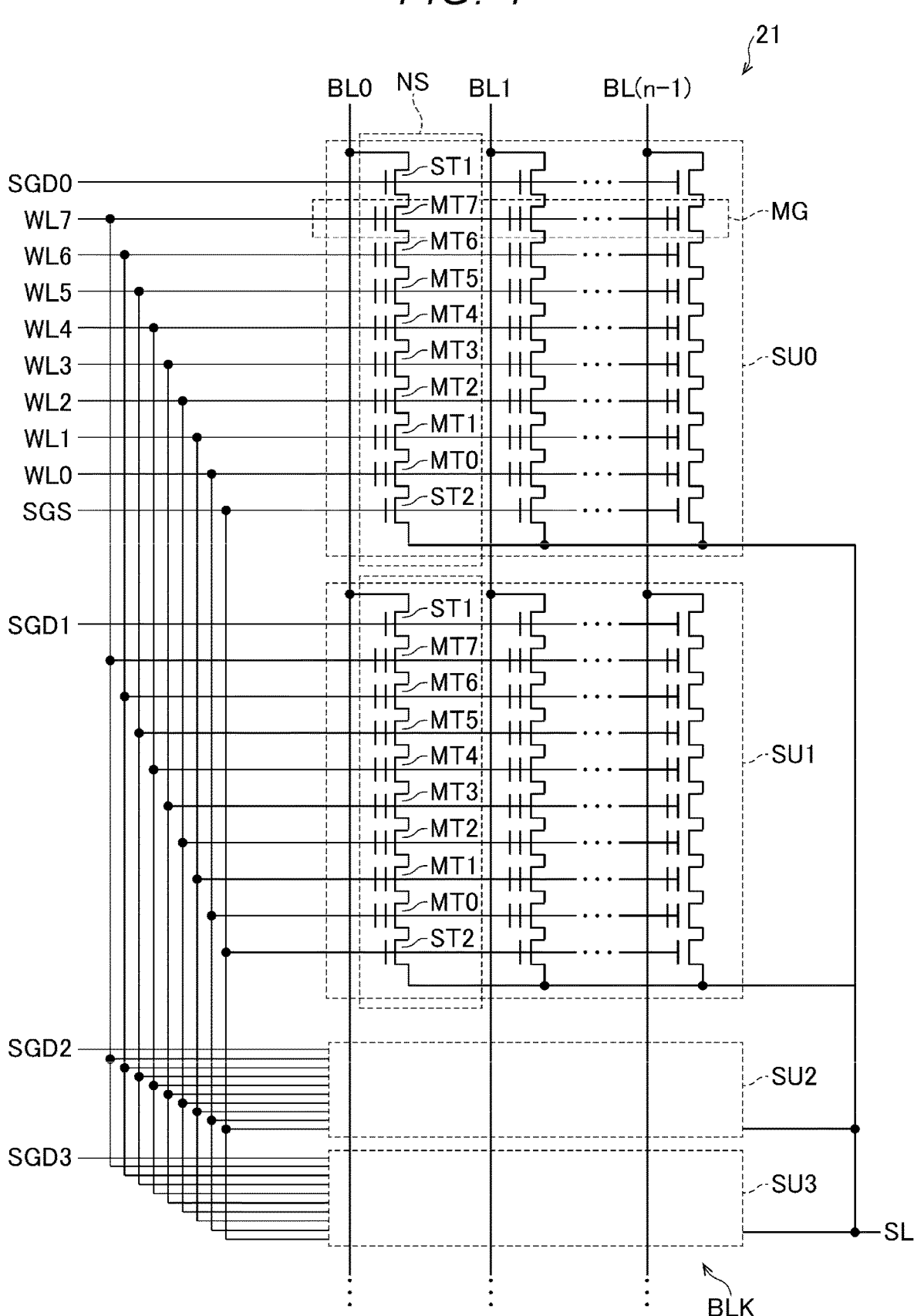
FIG. 4 is a circuit diagram showing a configuration of the semiconductor memory device of the first embodiment.

Next, the circuit configuration of the memory cell array 21 will be described. As shown in FIG. 4, the memory cell array 21 is configured with a plurality of blocks BLK. In FIG. 4, only one of the plurality of blocks BLK is shown. The configuration of the other block BLK provided in the memory cell array 21 is the same as that shown in FIG. 4.

As shown in FIG. 4, the block BLK includes, for example, four string units SU (SU0 to SU3). Further, each string unit SU includes a plurality of NAND strings NS. Each of the NAND strings NS includes, for example, eight memory cell transistors MT (MT0 to MT7) and select transistors ST1 and ST2.

The number of memory cell transistors MT is not limited to eight, and may be, for example, 32, 48, 64, or 96. For example, in order to improve the cutoff characteristic, each of the select transistors ST1 and ST2 may be configured with a plurality of transistors instead of a single transistor. Further, a dummy cell transistor may be provided between the memory cell transistor MT and the select transistors ST1 and ST2.

The memory cell transistors MT are arranged to be connected in series between the select transistor ST1 and the select transistor ST2. The memory cell transistor MT7 on one end side is connected to the source of the select transistor ST1, and the memory cell transistor MT0 on the other end side is connected to the drain of the select transistor ST2. The "source" and "drain" of the MOS transistor are relative. For example, in an N-channel type MOS transistor (a transistor in which an electron serves as a carrier) having two diffusion layers and a gate, the side to which a low voltage is supplied of the two diffusion layers functions as a source as a supply source of carriers, and the side to which a high voltage is supplied functions as a drain as an outlet of carriers. In other words, the two diffusion layers in the MOS transistor function as "one of the source or the drain" and "the other of the source or the drain", respectively. In the following description, for convenience, a side to which a lower voltage is supplied in a normal state may be referred to as a "source", and a side to which a higher voltage is supplied in a normal state may be referred to as a "drain". In this case, the "source" and the "drain" may not match the supply source and the outlet of the carrier.

The gates of the select transistors ST1 of the string units SU0 to SU3 are commonly connected to select gate lines SGD0 to SGD3, respectively. The gate of the select transistor ST2 is commonly connected to the same select gate line SGS among the plurality of string units SU in the same block BLK. The gates of the memory cell transistors MT0 to MT7 in the same block BLK are commonly connected to word lines WL0 to WL7, respectively. That is, the word lines WL0 to WL7 and the select gate line SGS are shared among the plurality of string units SU0 to SU3 in the same block BLK, whereas the select gate lines SGD are individually provided for each of the string units SU0 to SU3 even in the same block BLK.

The memory cell array 21 is provided with n bit lines BL (BL0, BL1, . . . , BL (n−1)). "n" is an integer corresponding to the number of NAND strings NS provided in one string unit SU. For example, in a case where the semiconductor memory device 2 is configured to write to the memory cell array 21 or read from the memory cell array 21 with 16 kilobytes of data (16 kB) as one unit, "n" is 131072 (2 to the 17th power). The drain of each select transistor ST1 of the NAND string NS is connected to the corresponding bit line BL. The source of each select transistor ST2 of the NAND string NS is connected to a source line SL. The source line SL is common to the sources of a plurality of select transistors ST2 provided in the block BLK.

The data stored in a plurality of memory cell transistors MT in the same block BLK are collectively erased. On the other hand, reading and writing of data are collectively performed for the plurality of memory cell transistors MT connected to one word line WL and belonging to one string unit SU.

In the following description, a set of 1-bit data connected to one word line WL and stored by the plurality of memory cell transistors MT belonging to one string unit SU is referred to as a "page". In FIG. 4, one set of the plurality of memory cell transistors MT as described above is denoted by the label "MG".

1.5 Cross-Sectional Structure of Semiconductor Memory Device

Figure 5:
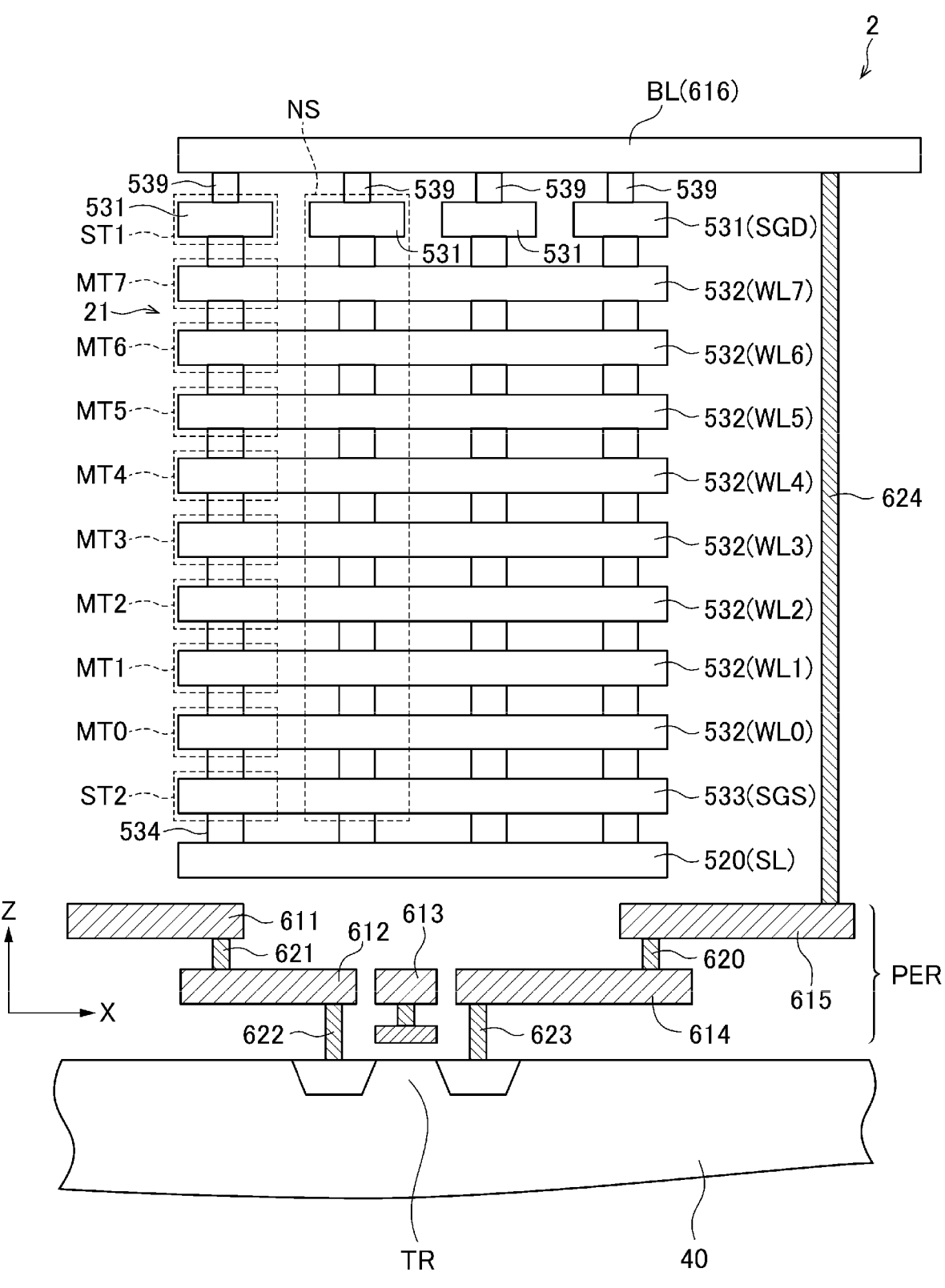
FIG. 5 is a cross-sectional diagram showing a cross-sectional structure of a semiconductor memory device of the first embodiment.

As shown in FIG. 5, the semiconductor memory device 2 has a structure in which a peripheral circuit PER and the memory cell array 21 are stacked on a semiconductor substrate 40. The semiconductor memory device 2 of the present embodiment has a so-called CMOS under array (CUA) structure in which the peripheral circuit PER is disposed below the memory cell array 21.

In the memory cell array 21, a plurality of NAND strings NS are formed on a conductor layer 520. The conductor layer 520 is also referred to as a buried source line (BSL), and corresponds to the source line SL in FIG. 3. Above the conductor layer 520, a wiring layer 533 that functions as a select gate line SGS, a plurality of wiring layers 532 that function as a word line WL, and a wiring layer 531 that functions as a select gate line SGD are stacked. An insulating layer (not shown) is disposed between each of the stacked wiring layers 533, 532, and 531.

A plurality of memory holes 534 are formed in the memory cell array 21. The memory hole 534 is a hole that penetrates the wiring layers 533, 532, 531 and the insulating layer (not shown) therebetween in the vertical direction and reaches the conductor layer 520. Each portion of the memory hole 534 that intersects each of the stacked wiring layers 533, 532, and 531 functions as a transistor. Among these plurality of transistors, the one at the intersection of the memory hole 534 and the wiring layer 531 functions as the select transistor ST1. Among the plurality of transistors, the ones at the intersection of the memory hole 534 and the wiring layers 532 function as memory cell transistors MT0 to MT7. Among the plurality of transistors, the one at the intersection of the memory hole 534 and the wiring layer 533 functions as the select transistor ST2.

A wiring layer 616 that functions as a bit line BL is formed above the memory hole 534. The upper end of the memory hole 534 is connected to the wiring layer 616 via a contact plug 539. A plurality of structures similar to the structure shown in FIG. 5 are arranged along the depth direction of the paper surface of FIG. 5. One string unit SU is formed by a set of the plurality of NAND strings NS arranged in a row along the depth direction of the paper surface in FIG. 5.

The semiconductor substrate 40 and the conductor layer 520 (source line SL) are disposed apart from each other, and a part of the peripheral circuit PER is disposed therebetween. The peripheral circuit PER is a circuit that supports a data write operation, a read operation, an erasing operation, and the like in the memory cell array 21. The sense amplifier 28, the row decoder 27, the voltage generation circuit 26, and the like shown in FIG. 2 are parts of the peripheral circuit PER.

The peripheral circuit PER includes a transistor TR formed on the upper surface of the semiconductor substrate 40 and a plurality of conductors 611 to 615. The conductors 611 to 615 are wiring layers formed of conductors such as, for example, metal. The conductors 611 to 615 are distributed at a plurality of height positions, and are electrically connected to each other via contacts 620 to 623. The contacts 620 to 623 are formed by forming contact holes to penetrate the insulating layer (not shown) in the vertical direction, and then filling the inside of the contact holes with a conductor material such as tungsten. The conductor 615 is electrically connected to the wiring layer 616 (bit line BL) via a contact 624.

1.6 Configuration of Sense Amplifier

Figure 6:
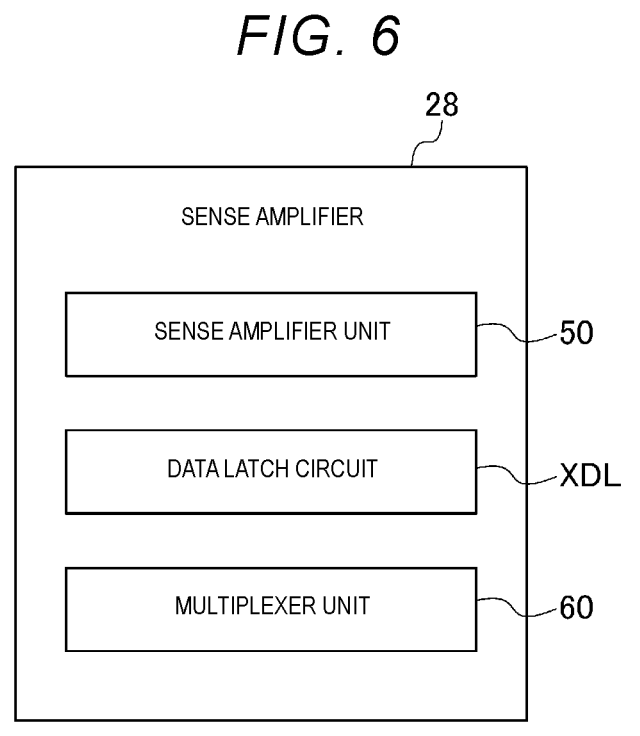

Next, the configuration of the sense amplifier 28 will be described in detail. As shown in FIG. 6, the sense amplifier 28 includes a sense amplifier unit 50, a data latch circuit XDL, and a multiplexer unit 60.

1.6.1 Configuration of Sense Amplifier Unit

Figure 7:
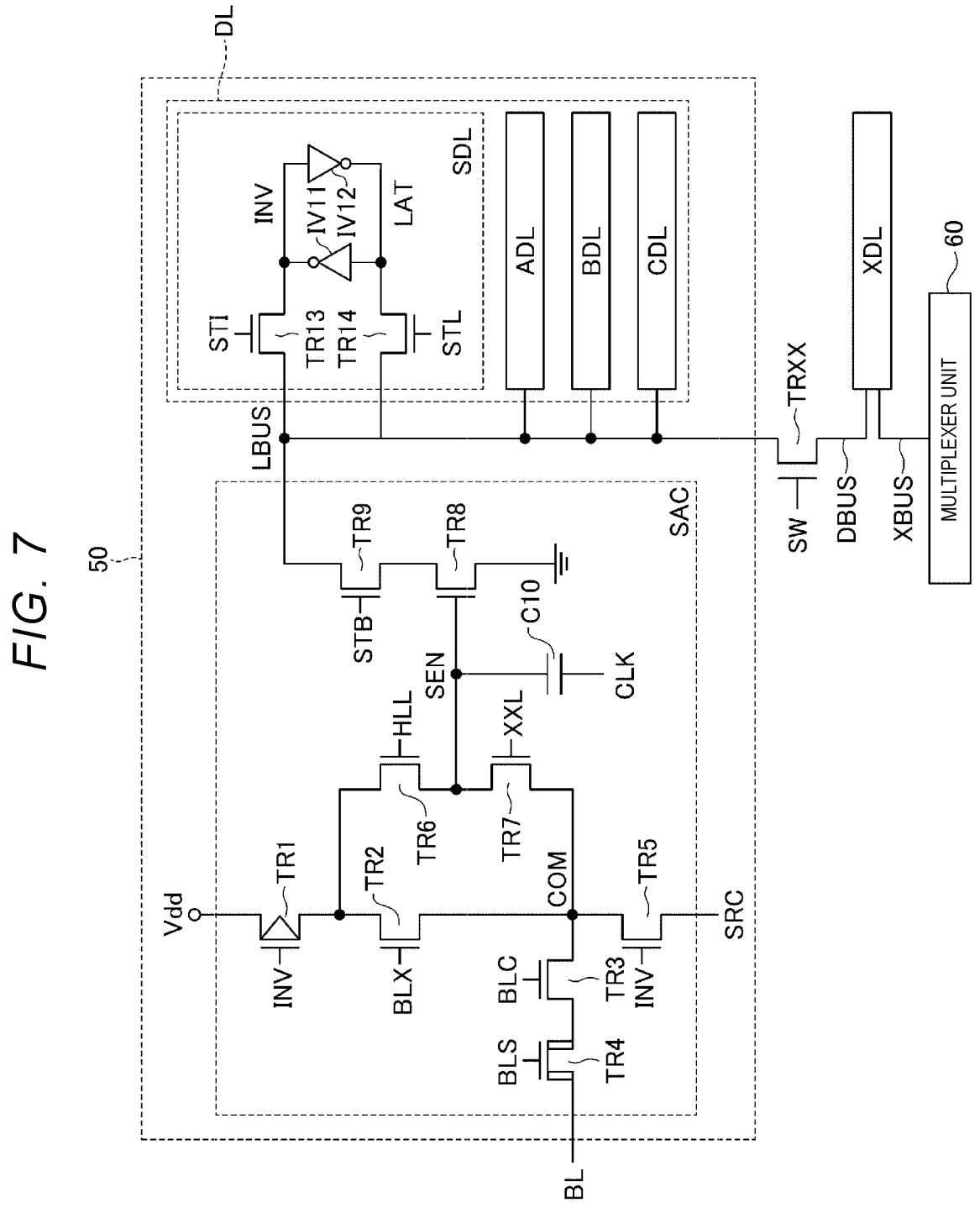
FIG. 7 is a block diagram showing a schematic configuration of a sense amplifier unit of the first embodiment.

The sense amplifier unit 50 is provided with n sense amplifiers, each of which is associated with each of the n bit lines BL. FIG. 7 shows the circuit configuration of one sense amplifier unit 50 among the n sense amplifier units.

As shown in FIG. 7, the sense amplifier unit 50 includes a sense amplifier circuit SAC, and a plurality of data latch circuits SDL, ADL, BDL, and CDL. The sense amplifier circuit SAC and the data latch circuits SDL, ADL, BDL, and CDL are connected by a bus LBUS through which data is exchanged. More specifically, the data latch circuits SDL, ADL, BDL, and CDL are connected to each other via a bus LBUS.

For example, in the read operation, the sense amplifier circuit SAC senses voltage of the corresponding bit line BL, and determines whether the read data is "0" or "1". The sense amplifier circuit SAC includes, for example, a transistor TR1 which is a P-channel type MOS transistor, transistors TR2 to TR9 which are N-channel type MOS transistors, and a capacitor C10.

One end of the transistor TR1 is connected to the power supply line. The other end of the transistor TR1 is connected to the transistor TR2. The gate of the transistor TR1 is connected to a node INV in the data latch circuit SDL. One end of the transistor TR2 is connected to the transistor TR1. The other end of the transistor TR2 is connected to the node COM. A control signal BLX is input to the gate of the transistor TR2. One end of the transistor TR3 is connected to the node COM. The other end of the transistor TR3 is connected to the transistor TR4. A control signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. A control signal BLS is input to the gate of the transistor TR4.

In the N-channel type MOS transistor having a high breakdown voltage, for example, a gate oxide film is thicker and a gate length is longer relative to a standard MOS transistor. In the sense amplifier circuit SAC of the present embodiment, for example, the transistors TR2 to TR3 and TR5 to TR9 are formed of standard N-channel type MOS transistors, and the transistor TR4 is formed of a high breakdown voltage N-channel type MOS transistor. In this case, in the transistor TR4, the gate oxide film is thicker and/or the gate length is longer than those of each of the transistors TR2 to TR3 and TR5 to TR9.

One end of the transistor TR5 is connected to the node COM. The other end of the transistor TR5 is connected to the node SRC. The gate of transistor TR5 is connected to a node INV. One end of the transistor TR6 is connected between the transistor TR1 and the transistor TR2. The other end of transistor TR6 is connected to the node SEN. A control signal HLL is input to the gate of the transistor TR6. One end of the transistor TR7 is connected to the node SEN. The other end of the transistor TR7 is connected to the node COM. A control signal XXL is input to the gate of the transistor TR7.

One end of the transistor TR8 is grounded. The other end of the transistor TR8 is connected to the transistor TR9. A gate of transistor TR8 is connected to the node SEN. One end of the transistor TR9 is connected to the transistor TR8. The other end of the transistor TR9 is connected to the bus LBUS. A control signal STB is input to the gate of the transistor TR9. One end of capacitor C10 is connected to the node SEN. A clock CLK is input to the other end of the capacitor C10.

The control signals BLX, BLC, BLS, HLL, XXL, and STB are generated by, for example, the sequencer 25. In addition, a voltage Vdd, which is, for example, an internal power supply voltage of the semiconductor memory device 2, is applied to a power supply line connected to one end of the transistor TR1. In this case, the sense amplifier circuit SAC belongs to the Vdd domain. For example, a voltage Vss, which is a ground voltage of the semiconductor memory device 2, is applied to the node SRC.

The data latch circuits SDL, ADL, BDL, and CDL temporarily latch the read data. The data latch circuit SDL includes, for example, inverters IV11 and IV12 and transistors TR13 and TR14 which are N-channel type MOS transistors. An input node of the inverter IV11 is connected to a node LAT. An output node of the inverter IV11 is connected to a node INV. An input node of the inverter IV12 is connected to the node INV. An output node of the inverter IV12 is connected to the node LAT. One end of the transistor TR13 is connected to the node INV, and the other end of the transistor TR13 is connected to the bus LBUS. A control signal ST1 is input to the gate of the transistor TR13. One end of the transistor TR13 is connected to the node LAT, and the other end of the transistor TR14 is connected to the bus LBUS. A control signal STL is input to the gate of the transistor TR14.

For example, the data latched in the node LAT corresponds to the data latched in the data latch circuit SDL. Further, the data latched in the node INV corresponds to the inverted data of the data latched in the node LAT. Since the circuit configurations of the data latch circuits ADL, BDL, and CDL are the same as the circuit configurations of the data latch circuits SDL, the description thereof will be omitted. Hereinafter, the data latch circuits ADL, BDL, and CDL are collectively referred to as a "data latch circuit DL".

1.6.2 Configuration of Data Latch Circuit XDL

As shown in FIG. 7, the data latch circuit XDL is connected to the bus DBUS. The bus DBUS is connected to the bus LBUS via a transistor TRXX. A control signal SW is input to the gate of the transistor TRXX. The data latch circuit XDL is connected to the multiplexer unit 60 via a bus XBUS. The data latch circuit XDL is used for inputting and outputting data between the sense amplifier unit 50 and the multiplexer unit 60.

Figure 8:
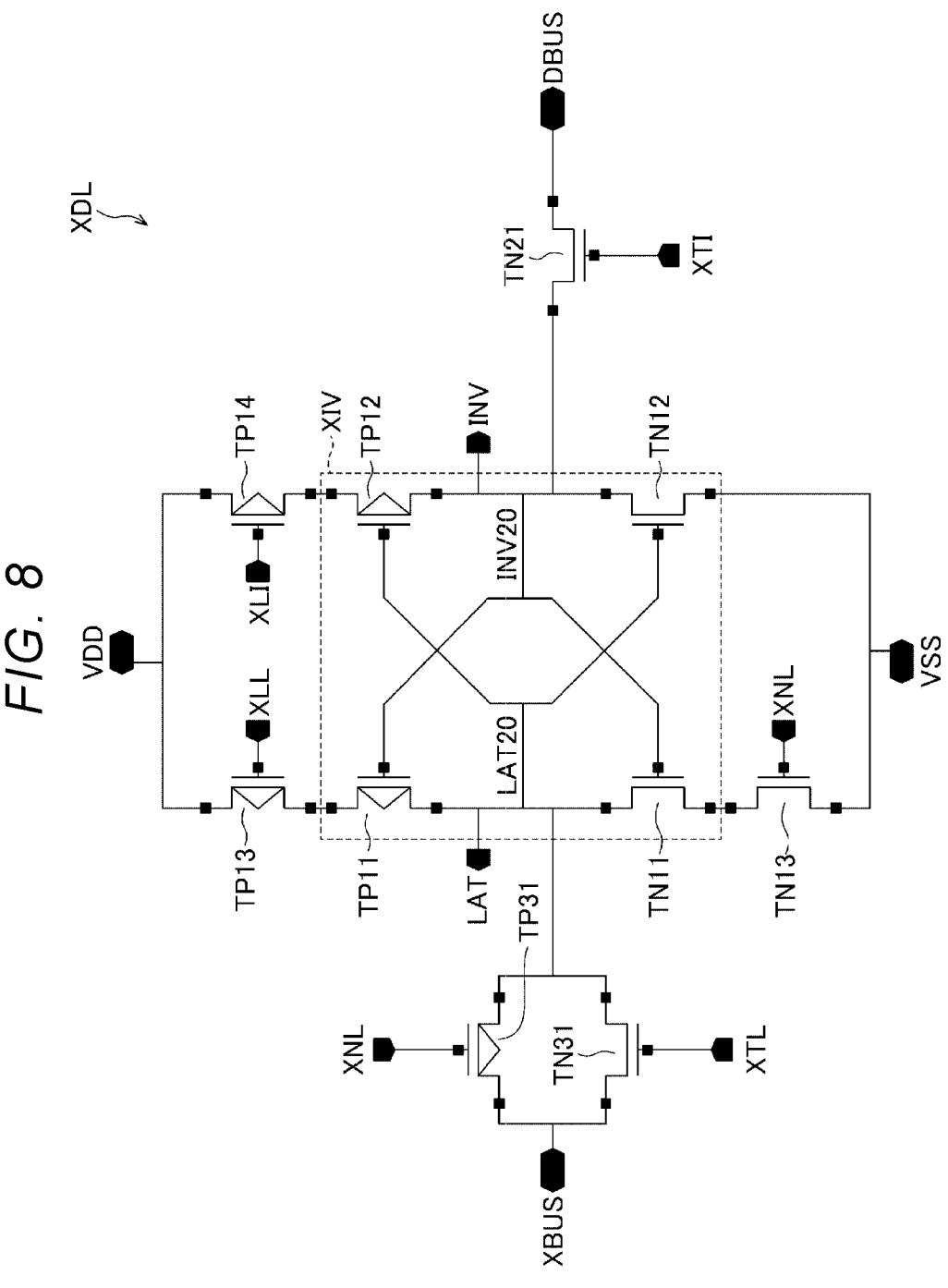
FIG. 8 is a circuit diagram showing a configuration of a data latch circuit of the first embodiment.

FIG. 8 shows a circuit configuration of the data latch circuit XDL. As shown in FIG. 8, the data latch circuit XDL includes P-channel type MOS transistors TP11 to TP14, and TP31, and N-channel type MOS transistors TN11 to TN13, TN21, and TN31.

The transistors TP11, TP12, TN11, and TN12 form a cross-connected inverter circuit XIV. That is, the transistors TP11 and TN11 form a first inverter circuit and are connected in series at the node LAT20. Each gate of the transistors TP11 and TN11 is connected to the node INV20. The node LAT20 and the node INV20 function as outputs and inputs of the first inverter circuit, respectively. The transistors TP12 and TN12 form a second inverter circuit and are connected in series at the node INV20. Each gate of the transistors TP12 and TN12 is connected to the node LAT20. The node LAT20 and the node INV20 function as inputs and outputs of the second inverter circuit, respectively.

Among the two ends of the current path of the transistor TP11, the end opposite to the end connected to the node LAT20 is connected to a power supply voltage node VDD via the transistor TP13. The power supply voltage node VDD is supplied with a voltage Vdd which is an internal power supply voltage of the semiconductor memory device 2. In this case, the data latch circuit XDL belongs to the Vdd domain. A control signal XLL generated by the sequencer 25 is input to the gate of the transistor TP13. The transistor TP13 functions as a switch circuit that is turned on/off based on the control signal XLL.

In the two ends of the current path of the transistor TP12, the end opposite to the end connected to the node INV20 is connected to the power supply voltage node VDD via the transistor TP14. A control signal XLI generated by the sequencer 25 is input to the gate of the transistor TP14. The transistor TP12 functions as a switch circuit that is turned on/off based on the control signal XLI.

In the two ends of the current path of the transistor TN11, the end opposite to the end connected to the node LAT20 is connected to a ground voltage node VSS via the transistor TN13. The ground voltage Vss is supplied to the ground voltage node VSS. A control signal XNL generated by the sequencer 25 is input to the gate of the transistor TN13. The transistor TN13 functions as a switch circuit that is turned on/off based on the control signal XNL.

In the two ends of the current path of the transistor TN12, the end opposite to the end connected to the node INV20 is connected to the ground potential node VSS. The transistor TN21 is connected between the bus DBUS and the node INV20. A control signal XT1 generated by the sequencer 25 is input to the gate of the transistor TN21. The transistor TN21 functions as a switch circuit that is turned on/off based on the control signal XT1.

The transistors TP31 and TN31 are connected in parallel between the bus XBUS and the node LAT20. The control signal XNL generated by the sequencer 25 is input to the gate of the transistor TP31. A control signal XTL generated by the sequencer 25 is input to the gate of the transistor TN31. The transistors TP31 and TN31 function as a switch circuit that is turned on/off based on the control signals XNL and XTL.

Figure 9:
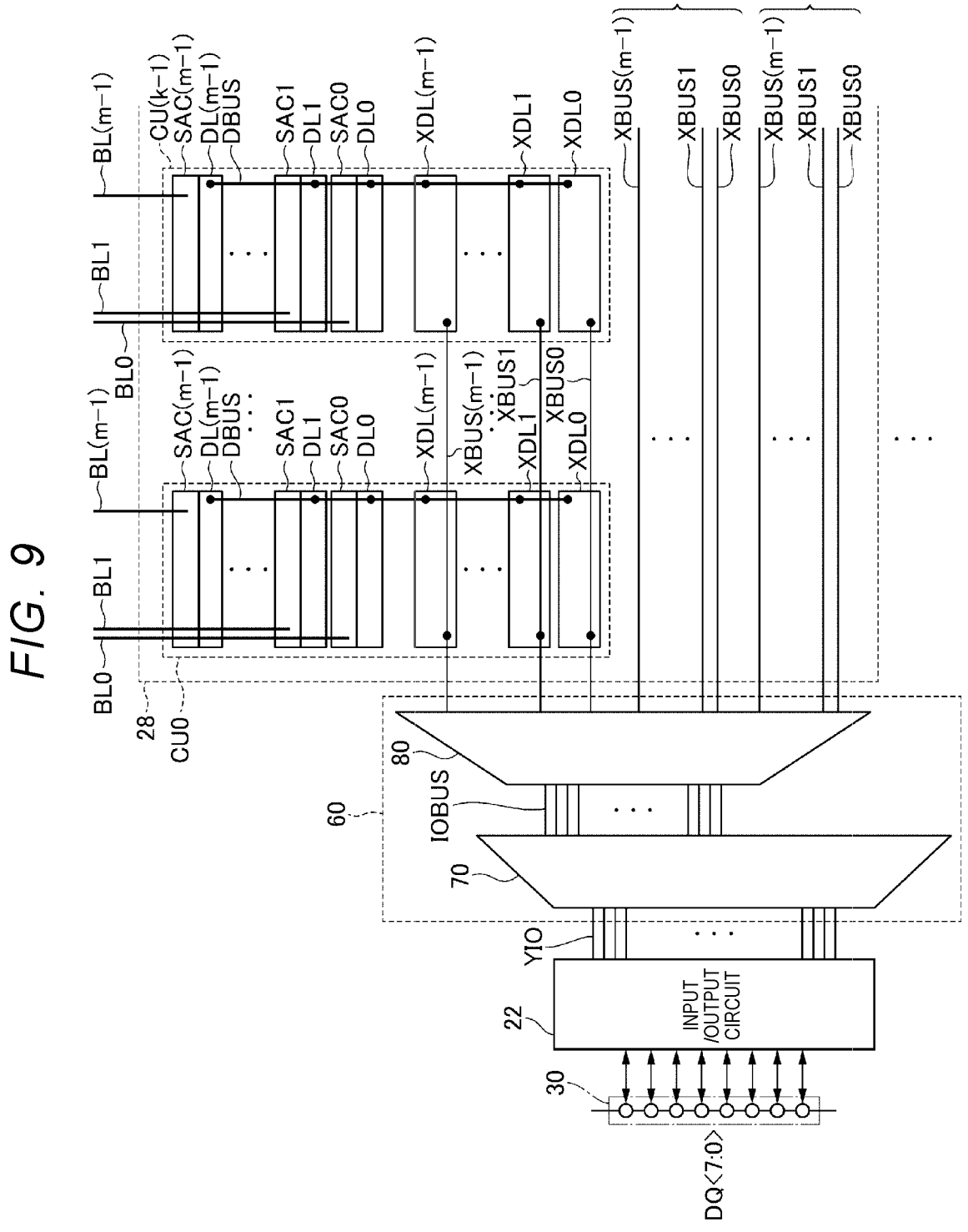
FIG. 9 is a block diagram showing configurations of a data latch circuit and an input/output circuit of the first embodiment.

As shown in FIG. 9, the sense amplifier 28 has k column units CU (CU0 to CU(k−1)). One column unit CU includes m sense amplifier circuits SAC (SA0 to SA(m−1)), m data latch circuits DL (DL0 to DL(m−1)), and m data latch circuits XDL (XDL0 to XDL(m−1)). "m" and "k" are integers and satisfy "m×k=n". "m" is, for example, 8 (2 to the 2nd power), and "k" is 16384 (2 to the 14th power). In other words, the n (131072, 2 to the 17th power) sense amplifier circuits SAC are divided into k (16384, 2 to the 14th power) column units CU, and each column unit CU includes m (8, 2 to the 3rd power) sense amplifier circuits SAC.

The m data latch circuits XDL are connected to the multiplexer unit 60 via m buses XBUS (XBUS0 to XBUS (m−1)). The m buses XBUS are commonly provided for, for example, 64 units of a plurality of column units CU. In other words, for example, 64 units of the plurality of column units CU are connected to the m buses XBUS. A plurality of sets of the buses XBUS are connected to the multiplexer unit 60 as one set of the bus XBUS to which the plurality of column units CU are connected as described above.

1.6.3 Configuration of Multiplexer Unit

Next, a configuration of the multiplexer unit 60 will be described. As shown in FIG. 9, the multiplexer unit 60 is connected to m data latch circuits XDL via m buses XBUS. In addition, the multiplexer unit 60 is connected to the input/output circuit 22 via a bus YIO.

The multiplexer unit 60 has a first multiplexer unit 70 and a second multiplexer unit 80. The first multiplexer unit 70 has w signal conversion units YLOG (YLOG0 to YLOG (w−1)) shown in FIG. 10. The w signal conversion units YLOG are connected to the input/output circuit 22 via w buses YIO. "w" is, for example, 64.

The signal conversion unit YLOG includes a NAND circuit 71 and a voltage conversion circuit 72. The voltage conversion circuit 72 has a transistor TP40 and a transistor TN40 connected in series. The transistor TP40 is a P-channel type MOS transistor, and the transistor TN40 is an N-channel type MOS transistor. One end of the transistor TP40 is connected to the power supply voltage node VCCQ. The power supply voltage VccQ is applied to the power supply voltage node VCCQ. In this case, the first multiplexer unit 70 belongs to the VccQ domain. The other end portion of the transistor TP40 is connected to the bus IOBUS. One end of the transistor TN40 is connected to the ground voltage node VSS. The other end portion of the transistor TN40 is connected to the bus IOBUS.

The bus YIO is connected to the input of the NAND circuit 71. Further, the control signal VDDREADn_Q generated by the sequencer 25 is input to the input of the NAND circuit 71 through the NOT circuit 73. The control signal VDDREADn_Q is set to a high level when the semiconductor memory device 2 is powered on, and is set to a low level in other cases. The output of the NAND circuit 71 is input to the gates of the transistors TP40 and TN40 of the voltage conversion circuit 72. In the present embodiment, the NAND circuit 71 and the NOT circuit 73 function as a ground voltage setting circuit 74 that sets the voltage of the bus IOBUS to the ground voltage Vss when the semiconductor memory device 2 is powered on.

Figure 10:
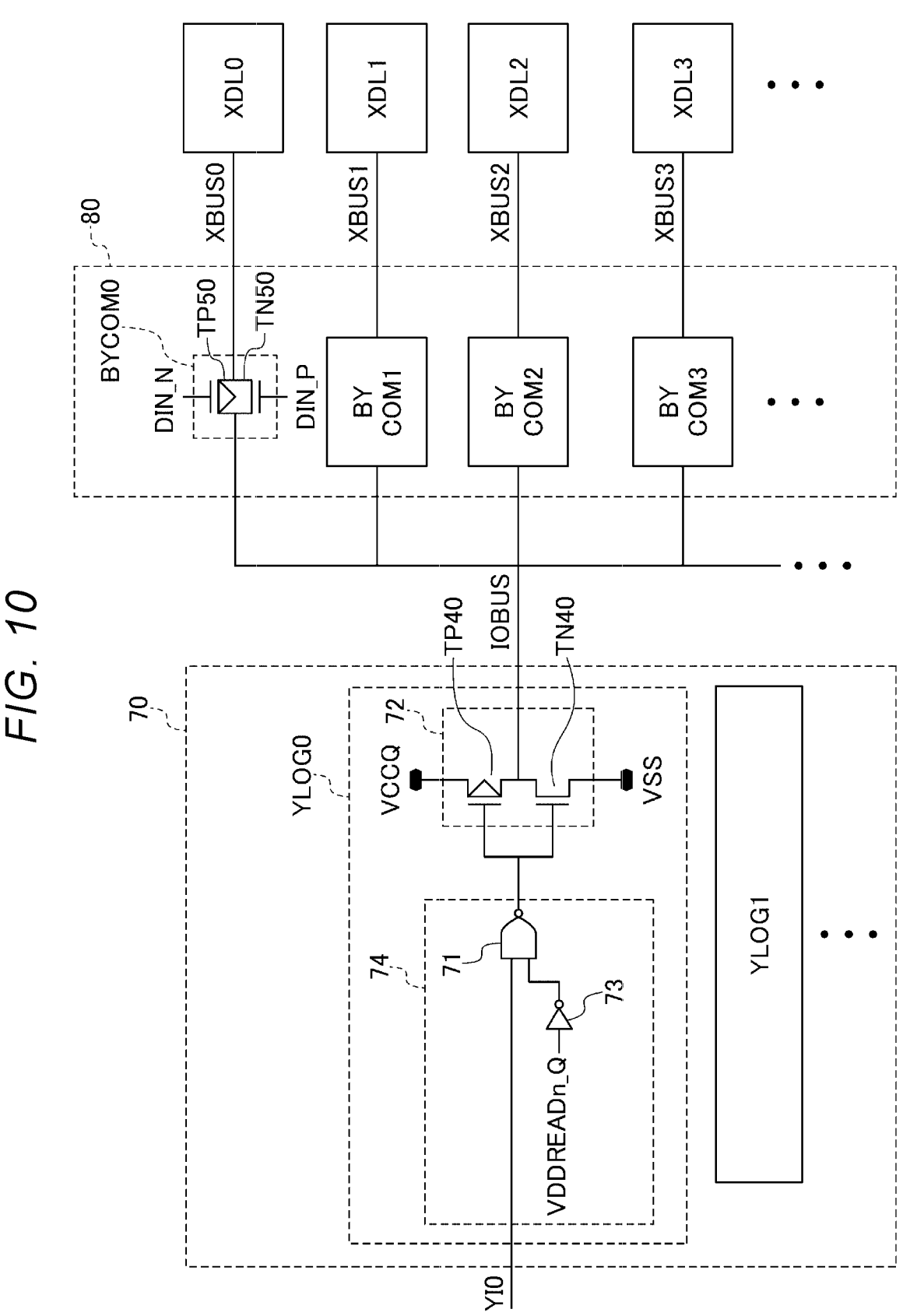
FIG. 10 is a block diagram showing a configuration of a sense amplifier unit of a first embodiment.

The second multiplexer unit 80 shown in FIG. 10 has m transfer gates BYCOM (BYCOM0 to BYCOM(m−1)) connected to m buses XBUS. The m transfer gates BYCOM are connected to the signal conversion unit YLOG of the first multiplexer unit 70 via one common bus IOBUS.

The transfer gate BYCOM includes a transistor TP50 and a transistor TN50 connected in parallel. The transistor TP50 is a P-channel type MOS transistor, and the transistor TN50 is an N-channel type MOS transistor. The bus IOBUS is connected to one end of each of the transistors TP50 and TN50, and the other end of each of the transistors TP50 and TN50 is connected to the bus XBUS. A control signal DIN_N generated by the sequencer 25 is input to the gate of the transistor TP50. A control signal DIN_P generated by the sequencer 25 is input to the gate of the transistor TN50.

As shown in FIG. 10, in the semiconductor memory device 2 of the present embodiment, the signal conversion unit YLOG operates based on the power supply voltage VccQ. More specifically, the elements of the semiconductor memory device 2 including the input/output circuit 22 and the signal conversion unit YLOG belong to the VccQ domain and operate with the power supply voltage VccQ as the operation power supply. In addition, according to the present invention, at least part of the sequencer 25 belong to the VccQ domain. More specifically, at least a part of the sequencer 25 configured to generate a control signal VDDREADn_Q which will be described later belongs to the VccQ domain. On the other hand, as shown in FIGS. 7 and 8, the elements of the semiconductor memory device 2 including the data latch circuit XDL and the sense amplifier unit 50 belong to the Vdd domain and operate based on the power supply voltage Vdd higher than the power supply voltage VccQ. Therefore, in the semiconductor memory device 2 of the present embodiment, the operating voltage changes between the signal conversion unit YLOG and the data latch circuit XDL. In this case, the second multiplexer unit 80 corresponds to the boundary between the Vdd domain and the VccQ domain.

1.7 Operation Example of Semiconductor Memory Device (Writing of Data)

Next, an operation example of the semiconductor memory device 2 of the present embodiment, particularly, an operation example of the semiconductor memory device 2 when writing data based on an instruction from the memory controller 1 will be described.

When the memory controller 1 transmits predetermined data to the semiconductor memory device 2 in the signal DQ<7:0>, the signal DQ<7:0> is input to the input/output circuit 22 through the input/output pad group 30 shown in FIG. 2. The input/output circuit 22 converts the signal DQ<7:0> from a serial signal into a parallel signal, and transmits the signal DQ<7:0> to the first multiplexer unit 70 via a bus YIO shown in FIG. 9.

At this time, for example, when a high-level signal corresponding to the data of "1" is transmitted to the bus YIO, the high-level signal is input to the NAND circuit 71 shown in FIG. 10 via the bus YIO. In addition, since the control signal VDDREADn_Q is set to a low level, a high-level signal obtained by inverting the control signal VDDREADn_Q by the NOT circuit 73 is input to the NAND circuit 71. The NAND circuit 71 calculates the negative logical product of the high-level signal input via the bus YIO and the high-level signal input from the NOT circuit 73, and outputs a low-level signal. Therefore, in the voltage conversion circuit 72, the transistor TP40 is turned on, while the transistor TN40 is turned off. Accordingly, the bus IOBUS is connected to the power supply voltage node VCCQ. Therefore, as shown in FIG. 11A, the voltage VccQ is transmitted to the bus IOBUS at time T10.

Thereafter, one of the m data latch circuits XDL is connected to the bus IOBUS shown in FIG. 10. For example, as shown in FIGS. 11B and 11C, the sequencer 25 sets the control signal DIN_N input to the transfer gate BYCOM0 at the time T11 to a low level and sets the control signal DIN_P to a high level, so that the transistors TP50 and TN50 of the transfer gate BYCOM0 are turned on. The high level of the control signals DIN_N and DIN_P is the voltage Vdd, and the low level of the control signals DIN_N and DIN_P is the ground voltage Vss.

Figure 11:
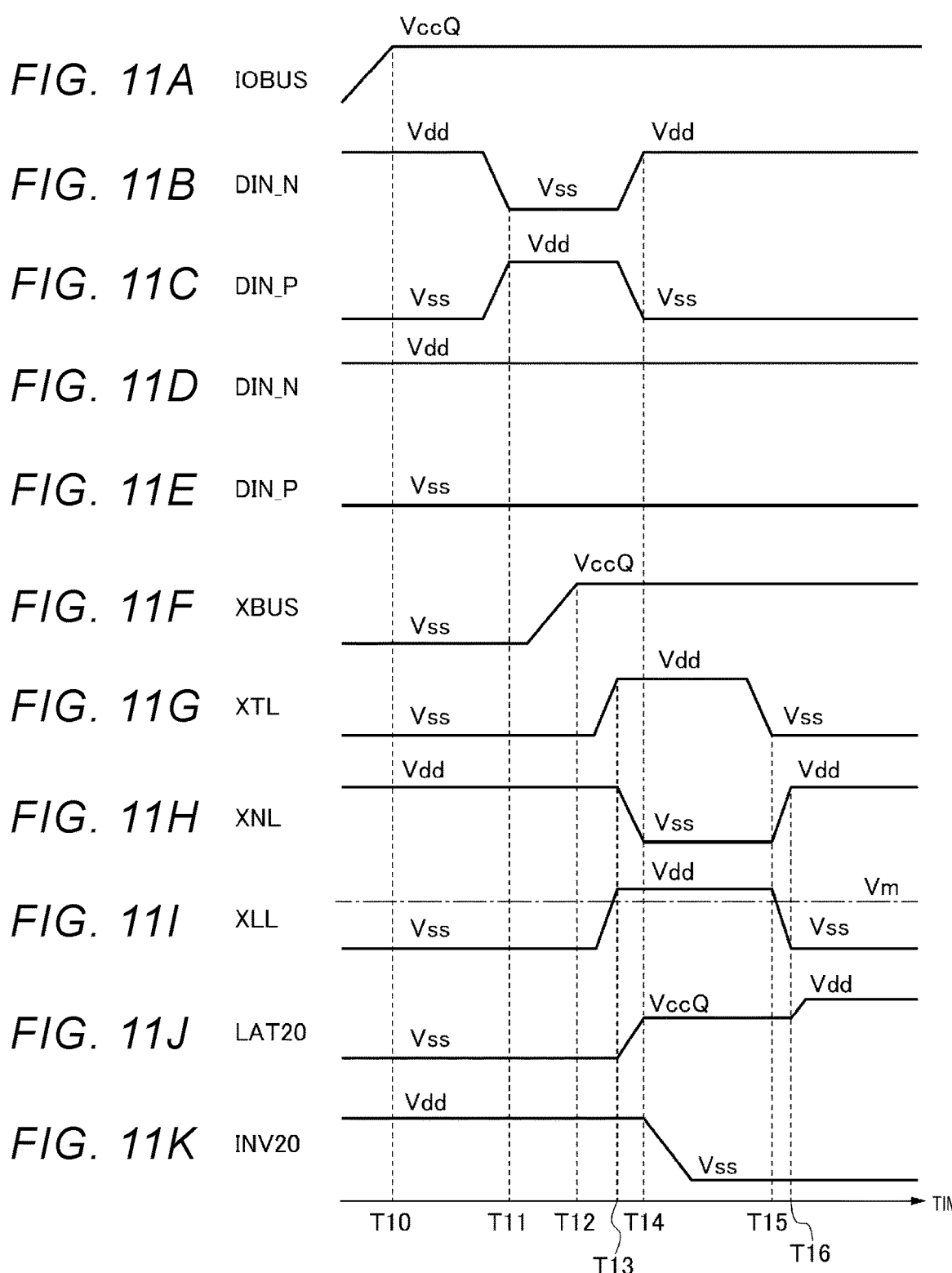
FIGS. 11A to 11K are timing charts showing operation examples of the semiconductor memory device of the first embodiment.

Meanwhile, as shown in FIGS. 11D and 11E, the sequencer 25 maintains the control signals DIN_N input to each of the transfer gates BYCOM1 to BYCOM(m−1) at a high level and maintains the control signal DIN_P at a low level, and thus maintains the transistors TP50 and TN50 of each of the transfer gates BYCOM1 to BYCOM(m−1) in an off state. As a result, the data latch circuit XDL0 corresponding to the transfer gate BYCOM0 is connected to the bus IOBUS, and the voltage transmitted to the bus IOBUS is input to the data latch circuit XDL0 via the bus XBUS0. As a result, as shown in FIG. 11F, the bus XBUS0 is set to the power supply voltage node VCCQ at time T12.

Figure 12:
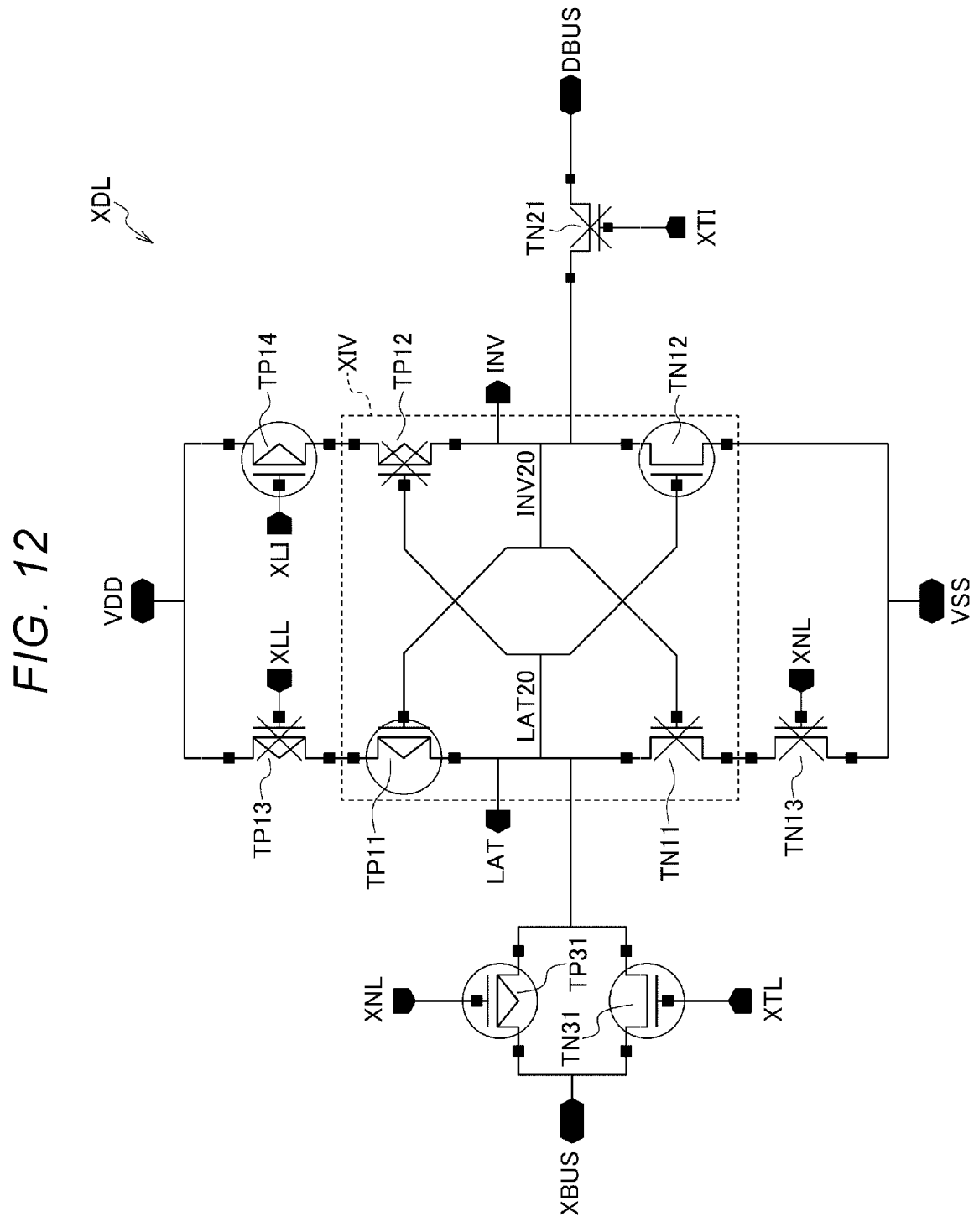
FIG. 12 is a circuit diagram showing an operation example of a data latch circuit of the first embodiment.

Subsequently, the voltage of the bus XBUS0 is supplied to the data latch circuit XDL0. Specifically, as shown in FIGS. 11G to 11I, the sequencer 25 sets the control signals XTL and XLL to the high level at the time T13 and sets the control signal XNL to the low level at the time T14. The high level of the control signals XTL, XNL, and XLL is the voltage Vdd, and the low level of the control signals XTL, XNL, and XLL is the ground voltage Vss. As a result, as shown in FIG. 12, the transistors TP31 and TN31 are turned on, and the transistors TP13 and TN13 are turned off in the data latch circuit XDL. In FIG. 12, a circle is attached to the transistor in the on-state, and a cross is attached to the transistor in the off-state.

The sequencer 25 sets the control signals XLI and XT1 shown in FIG. 12 to low levels at the time T13. Therefore, the transistor TP14 is turned on, and the transistor TN21 is turned off. The high level of the control signals XLI and XT1 is the voltage Vdd, and the low level of the control signals XLI and XT1 is the ground voltage Vss.

When the transistor TN31 is turned on at time T13, the voltage VccQ of the bus XBUS0 is transmitted to the node LAT20 via the transistor TN31. As a result, as shown in FIG. 11J, the node LAT20 is set to the power supply voltage VccQ at time T14. In addition, as shown in FIG. 12, the node LAT20 is set to the power supply voltage VccQ, so that the transistor TP12 is turned off while the transistor TN12 is turned on. Therefore, the node INV20 is connected to the ground voltage node VSS. Therefore, as shown in FIG. 11K, after time T14, the node INV20 is set to the ground voltage Vss.

As shown in FIG. 12, the node INV20 is set to the ground voltage Vss. Accordingly, the transistor TN11 is turned off, and the transistor TP11 is turned on. At this time, since the transistor TP13 is in an off state, the voltage Vdd of the power supply voltage node VDD is not supplied to the node LAT20.

Figure 13:
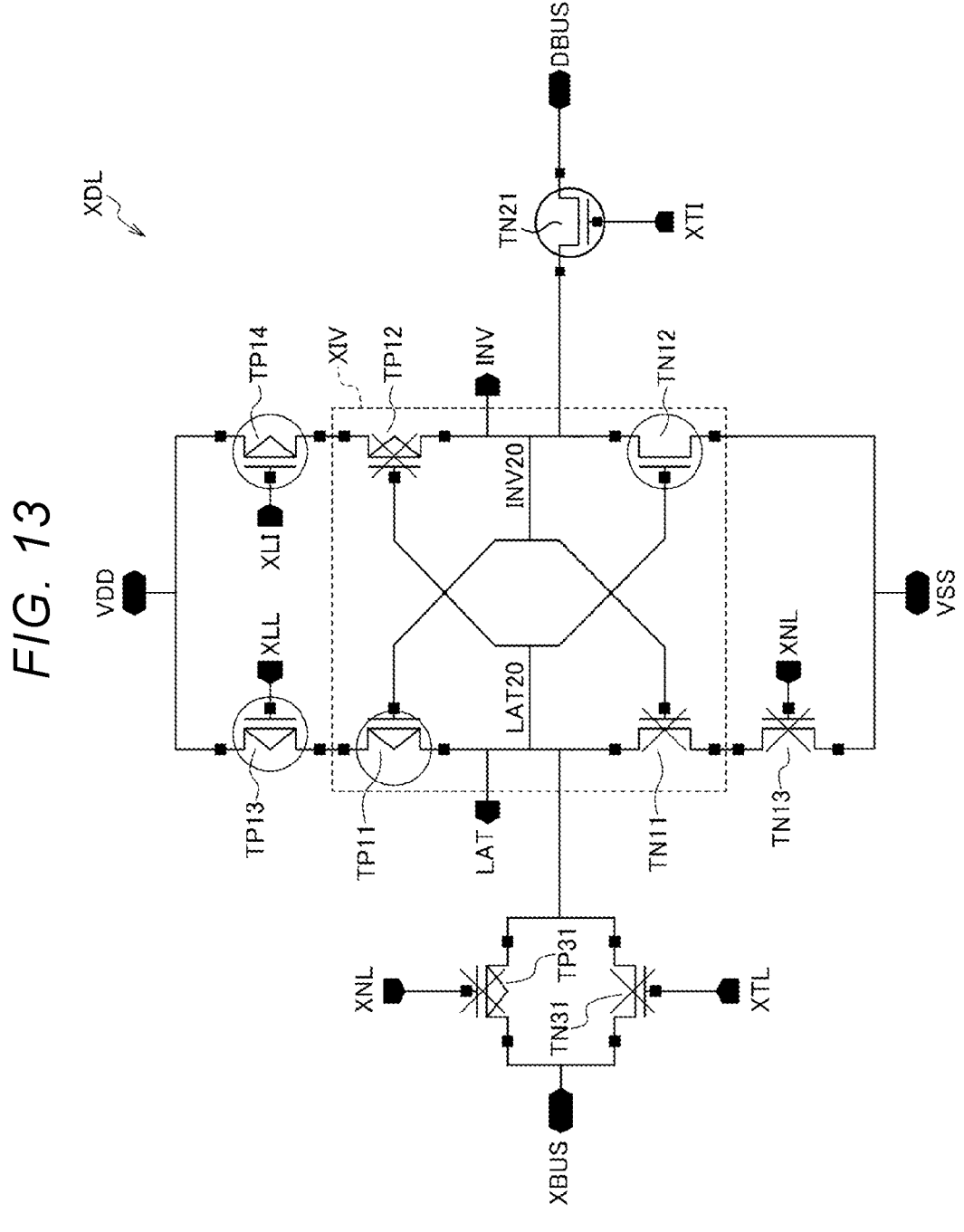
FIG. 13 is a circuit diagram showing an operation example of a data latch circuit of the first embodiment.

Meanwhile, as shown in FIGS. 11B and 11C, when the sequencer 25 sets the control signal DIN_N to a high level and sets the control signal DIN_P to a low level at the time T14, the transistors TP50 and TN50 shown in FIG. 10 are turned off. As a result, the bus XBUS0 and the data latch circuit XDL0 are electrically disconnected from the bus IOBUS. Subsequently, as shown in FIGS. 11G and 11H, when the sequencer 25 sets the control signal XTL to the low level at time T15 and sets the control signal XNL to the high level at time T16, as shown in FIG. 13, both the transistors TP31 and TN31 are turned off. As a result, the node LAT20 is electrically disconnected from the bus XBUS0.

In addition, as shown in FIG. 11I, the sequencer 25 sets the control signal XLL to a low level at time T16, so that the transistor TP13 is turned on as shown in FIG. 13. As a result, the power supply voltage Vdd of the power supply voltage node VDD is supplied to the node LAT20 via the transistors TP13 and TP11. Therefore, as shown in FIG. 11J, after the time T16, the node LAT20 transitions from the voltage VccQ to the voltage Vdd.

As described above, as shown in FIGS. 11J and 11K, the voltage Vdd is latched in the node LAT20, and the ground voltage Vss is latched in the node INV20. Hereinafter, when the data is output from the data latch circuit XDL0 to the bus DBUS, the sequencer 25 sets the control signal XT1 to a high level in the state shown in FIG. 13 to turn on the transistor TN21. As a result, the voltage Vss latched in the node INV20 is transferred to the bus DBUS, that is, the data latched in the data latch circuit XDL0 is transferred to bus DBUS.

Figure 14:
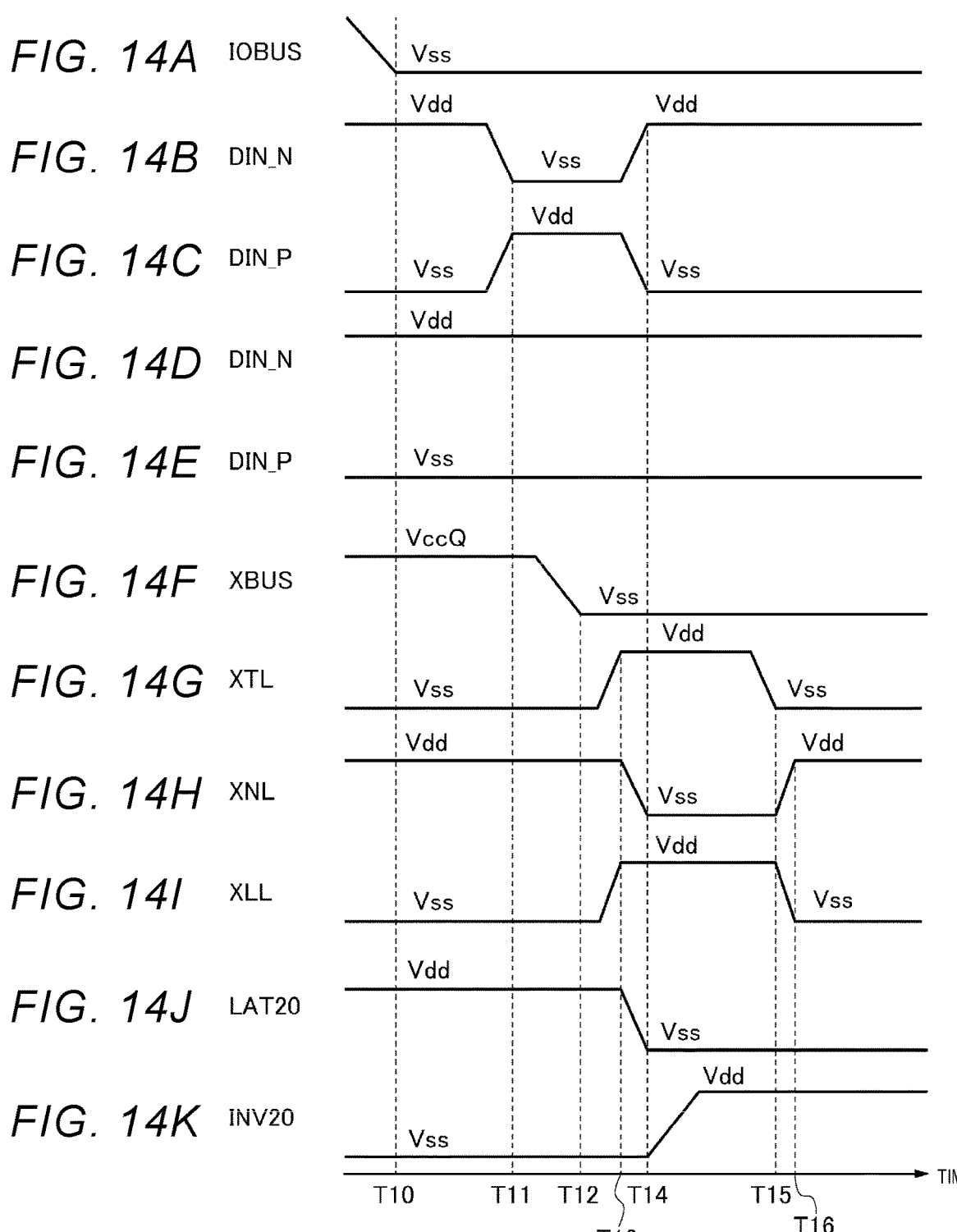
FIGS. 14A to 14K are timing charts showing operation examples of the semiconductor memory device of the first embodiment.

The operation of the semiconductor memory device 2 when the data of "1" is transmitted to the bus YIO has been described above. When the data of "0" is transmitted to the bus YIO, the semiconductor memory device 2 operates as shown in, for example, FIGS. 14A to 14K. Since the operation of the semiconductor memory device 2 at this time is similar to the case where the data of "1" is transmitted to the bus YIO, a detailed description thereof will be omitted. In this case, as shown in FIGS. 14J and 14K, the node LAT20 is set to the ground voltage Vss, and the node INV20 is set to the power supply voltage Vdd.

1.8 Operation Example of Semiconductor Memory Device (When Power-On)

In such a semiconductor memory device 2, since each voltage generated by the voltage generation circuit 26 is unstable at the time point when the power-on is started, for example, there is a possibility that the indefinite voltage of the power supply voltage node VCCQ in the VccQ domain is higher than the indefinite voltage of the power supply voltage node VDD in the Vdd domain.

In the P-channel type transistor TP50 of the transfer gate BYCOM shown in FIG. 10, the power supply voltage Vdd is applied to the back gate (N-type area). In a situation where the voltage is unstable, such as when the power of the semiconductor memory device 2 is turned on, a voltage that is used in the signal conversion unit YLOG, specifically, a voltage that is higher than the ground voltage node VSS and lower than the indefinite voltage of the power supply voltage node VCCQ may be applied to the bus IOBUS. As described above, since there is a possibility that the indefinite voltage of the power supply voltage node VCCQ is higher than the indefinite voltage of the power supply voltage node VDD when the power is turned on, there is a possibility that a voltage higher than the indefinite voltage of the power supply voltage node VDD is applied to the bus IOBUS. In such a case, in the P-channel type transistor TP50 of the transfer gate BYCOM shown in FIG. 10, the forward bias is generated by the N-type area serving as the back gate and the P-type area serving as the source/drain end on the bus IOBUS side. Therefore, there is a possibility that an unintended current may flow into the semiconductor memory device 2, which is not preferable.

Figure 15:
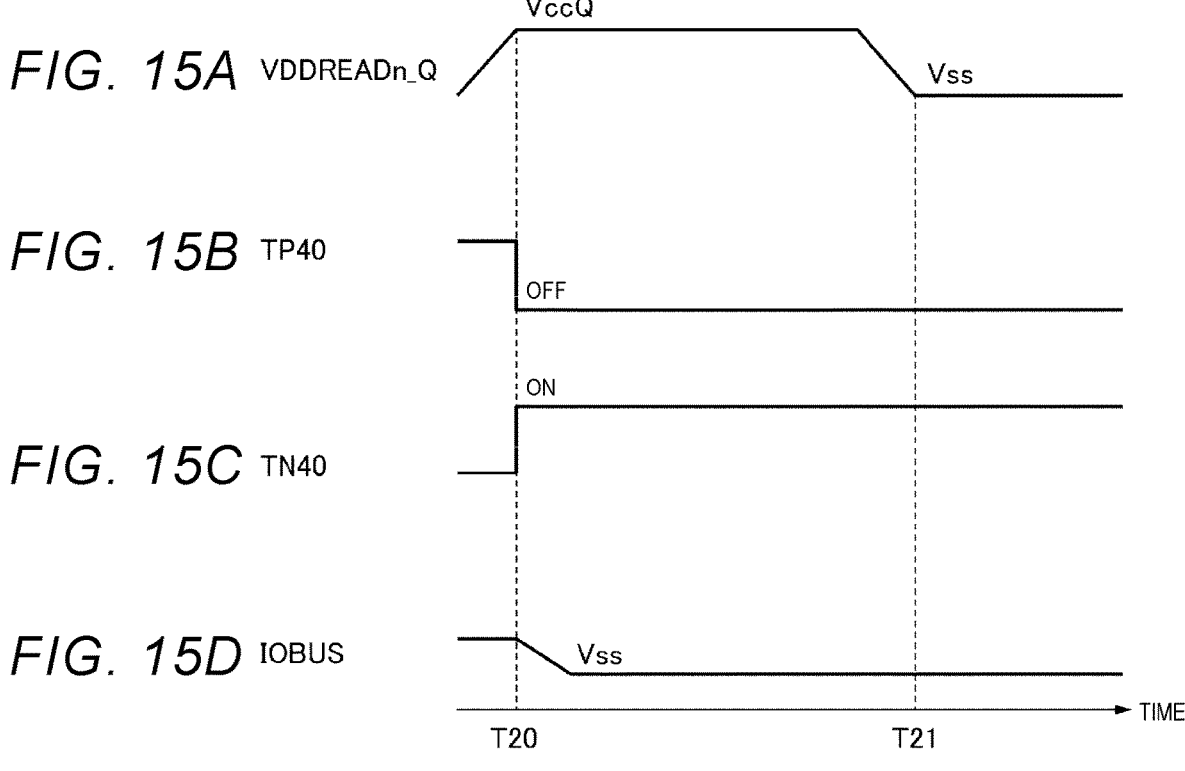
FIGS. 15A to 15D are timing charts showing operation examples of the semiconductor memory device of the first embodiment.

Therefore, in the semiconductor memory device 2 of the present embodiment, the bus IOBUS is set to the ground voltage node VSS at the time of power-on. Specifically, for example, as shown in FIG. 15A, when the power-on processing is started in the semiconductor memory device 2 at time T20, the sequencer 25 sets the control signal VDDREADn_Q to a high level. The control signal VDDREADn_Q is inverted by the NOT circuit 73 shown in FIG. 10 and is input to the NAND circuit 71. Therefore, a low-level signal is input to the NAND circuit 71 from the NOT circuit 73. Therefore, the NAND circuit 71 outputs a high-level signal regardless of the signal level of the bus YIO. Accordingly, the transistor TP40 of the voltage conversion circuit 72 is turned off while the transistor TN40 is turned on. Accordingly, the bus IOBUS is connected to the ground voltage node VSS via the transistor TN40, and the bus IOBUS is set to the ground voltage Vss. FIGS. 15B and 15C show transitions of on/off states of each of the transistors TP40 and TN40, and FIG. 15D shows transitions of the voltages of the bus IOBUS.

After that, when the power-on processing is completed in the semiconductor memory device 2, that is, when each voltage generated by the voltage generation circuit 26 is stabilized, the sequencer 25 sets the control signal VDDREADn_Q to a low level at time T21. As a result, a signal obtained by inverting the control signal VDDREADn_Q by the NOT circuit 73, that is a high-level signal is input to the NAND circuit 71. Therefore, after time T21, the output of the NAND circuit 71 changes according to the voltage level of the bus IOBUS, so that the operation of the semiconductor memory device 2 as described in Section 1.7 above is carried out.

1.9 Effects

The semiconductor memory device 2 of the present embodiment includes a memory cell array 21 including a plurality of memory cell transistors MT, and a sense amplifier 28 provided between the memory cell array 21 and the input/output circuit 22. The sense amplifier 28 includes a data latch circuit XDL, a multiplexer unit 60, and a sense amplifier unit 50. The data latch circuit XDL temporarily latches the data written in the memory cell transistor MT and the data read from the memory cell transistor MT, the power supply voltage Vdd being applied as an operating voltage. The multiplexer unit 60 is provided between the input/output circuit 22 and the data latch circuit XDL, and the power supply voltage VccQ lower than the power supply voltage Vdd is applied as an operating voltage. The sense amplifier unit 50 senses the data latched in the memory cell transistor MT at the time of reading and latches the data in the data latch circuit XDL while the sense amplifier unit 50 stores the data latched in the data latch circuit XDL in the memory cell transistor MT at the time of writing. The data latch circuit XDL has a node LAT20 and a node INV20. The node LAT20 is connected to the multiplexer unit 60 and latches the voltage supplied from the multiplexer unit 60 via the bus IOBUS in accordance with the data to be latched. The node INV20 is connected to the sense amplifier unit 50 and latches the voltage level inverted from the voltage level latched by the node LAT20. The data latch circuit XDL causes the multiplexer unit 60 to apply the voltage VccQ to the node LAT20 to latch the voltage VccQ at the node LAT20, and then causes the voltage of the node LAT20 to transition from the voltage VccQ to the voltage Vdd.

According to this configuration, since the multiplexer unit 60 can be driven at the voltage VccQ lower than the voltage Vdd, the power consumption of the entire semiconductor memory device 2 can be reduced. In addition, since it is not necessary to provide a level shifter or the like for converting the operating voltage from the voltage VccQ to the voltage Vdd between the multiplexer unit 60 and the data latch circuit XDL, it is possible to simplify the circuit configuration.

The data latch circuit XDL has a power supply voltage node VDD and a transistor TP13. The power supply voltage Vdd is applied to the power supply voltage node VDD. The transistor TP13 is connected to the power supply voltage node VDD and the node LAT20. The sequencer 25 turns the transistor TP13 off when latching the voltage VccQ applied from the multiplexer unit 60 to the node LAT20 in the node LAT20. In addition, the sequencer 25 latches the node LAT20 at the voltage VccQ, and then turns on the transistor TP13 to cause the node LAT20 to transition from the voltage VccQ to the voltage Vdd.

According to this configuration, the data latch circuit XDL using the voltage Vdd as the operating voltage can be appropriately operated while the voltage VccQ is used as the operating voltage in the multiplexer unit 60. The multiplexer unit 60 further includes the transfer gate BYCOM that is disposed between the bus IOBUS and the data latch circuit XDL. The transfer gate BYCOM has a transistor TP50 which is a P-channel type MOS transistor and a transistor TN50 which is an N-channel type MOS transistor, the transistors being connected in parallel. The multiplexer unit 60 has a ground voltage setting circuit 74 that sets the voltage of the bus IOBUS to the ground voltage Vss when the semiconductor memory device 2 is powered on.

According to this configuration, since it is possible to avoid the occurrence of the forward bias in the P-channel type transistor TP50 of the transfer gate BYCOM, it is possible to avoid the malfunction of the semiconductor memory device 2 at an early stage. The multiplexer unit 60 includes a power supply voltage node VCCQ to which the voltage VccQ is applied from the voltage generation circuit 26, a ground voltage node VSS to which the ground voltage Vss is applied, a P-channel type transistor TP40, and an N-channel type transistor TN40. The transistor TP40 is provided between the power supply voltage node VCCQ and the bus IOBUS. The transistor TN40 is provided between the ground voltage node VSS and the bus IOBUS. The ground voltage setting circuit 74 sets the voltage of the bus IOBUS to the ground voltage Vss by inputting a signal in which it is possible to turn off the transistor TP40 to the gate of the transistor TP40 and inputting a signal in which it is possible to turn on the transistor TN40 to the gate of the transistor TN40 when the semiconductor memory device 2 is powered on.

According to this configuration, the voltage of the bus IOBUS can be easily set to the ground voltage Vss when the semiconductor memory device 2 is powered on.

1.10 Modification Example of First Embodiment

Next, a modification example of the semiconductor memory device 2 of the first embodiment will be described.

In the semiconductor memory device 2 of the present modification example, as indicated by the alternate long and short dash line in FIG. 11I, the sequencer 25 sets the control signal XLL to an intermediate voltage Vm between the high level voltage and the low level voltage. When the voltage Vdd is 1.5 V, the intermediate voltage Vm is set to a voltage in a range of 0.9 V to 1.0 V. As a result, the transistor TP13 of the data latch circuit XDL is in a switching state slightly closer to the on state than the completely off state, in other words, in an incomplete off state or a weak on state. As a result, after the node LAT20 is set to the voltage VccQ at time T13, the power supply voltage Vdd is supplied from the power supply voltage node VDD to the node LAT20 via the transistor TP13 that is not in a completely off state. Accordingly, the node LAT20 transitions from the voltage VccQ to the voltage Vdd.

As described above, the sequencer 25 of the present modification example applies the voltage Vm in the middle between the voltage Vdd and the ground voltage Vss to the gate of the transistor TP13 when latching the voltage VccQ applied from the multiplexer unit 60 to the node LAT20 in the node LAT20. In addition, the sequencer 25 maintains a state in which the node LAT20 is latched at the voltage VccQ and the intermediate voltage Vm is applied to the gate of the transistor TP13, and then causes the node LAT20 to transition from the voltage VccQ to the voltage Vdd.

Even with such a configuration, the operating voltage can be easily caused to transition from the voltage VccQ to the voltage Vdd in the data latch circuit XDL as in the semiconductor memory device 2 of the first embodiment.

2. Second Embodiment

A semiconductor memory device 2 of a second embodiment will be described. Hereinafter, the differences from the semiconductor memory device 2 of the first embodiment will be mainly described.

2.1 Configuration of Multiplexer Unit

Figure 16:
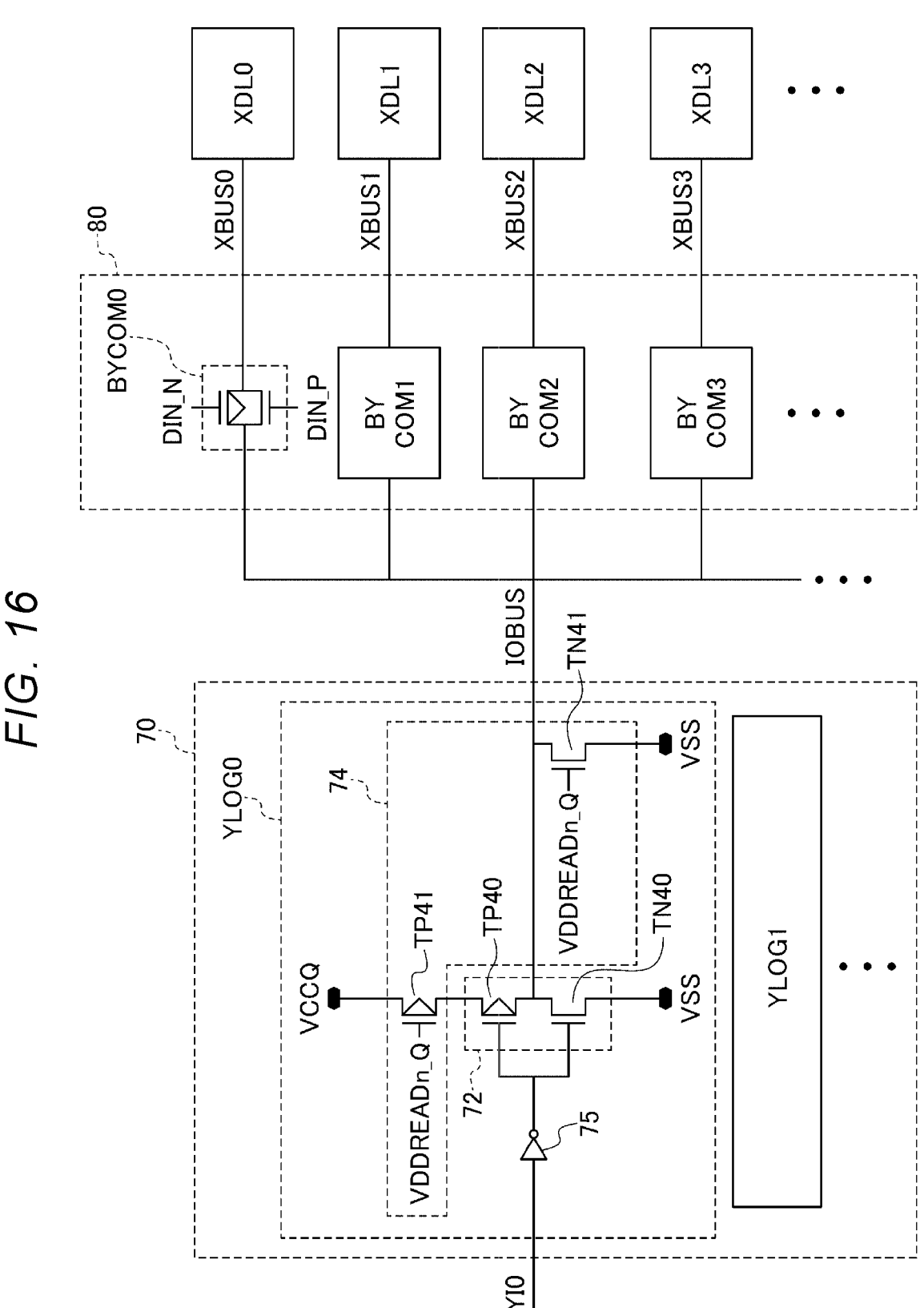
FIG. 16 is a block diagram showing a configuration of a sense amplifier unit of a second embodiment.

As shown in FIG. 16, the first multiplexer unit 70 of the present embodiment includes a NOT circuit 75 instead of the NAND circuit 71. In addition, the first multiplexer unit 70 further includes a transistor TP41 which is a P-channel type MOS transistor and a transistor TN41 which is an N-channel type MOS transistor. The transistor TP41 is provided between the power supply voltage node VCCQ and the transistor TP40. The transistor TN41 is provided between the bus IOBUS and the ground voltage node VSS. A control signal VDDREADn_Q is input to each of the gates of the transistors TP41 and TN41.

The sequencer 25 sets the control signal VDDREADn_Q to a high level voltage when the power of the semiconductor memory device 2 is turned on. As a result, the transistor TP41 is turned off and the transistor TN41 is turned on, so that the bus IOBUS is connected to the ground voltage node VSS via the transistor TN41. Therefore, the bus IOBUS is set to the ground voltage Vss.

2.2 Effects

In the semiconductor memory device 2 of the present embodiment, the transistors TP41 and TN41 function as the ground voltage setting circuit 74 that sets the bus IOBUS to the ground voltage when the power of the semiconductor memory device 2 is turned on. Even with such a configuration, since it is possible to avoid the occurrence of the forward bias in the P-channel type transistor TP50 of the transfer gate BYCOM, it is possible to prevent the malfunction of the semiconductor memory device 2 at an early stage.

3. Other Embodiments

Figure 17:
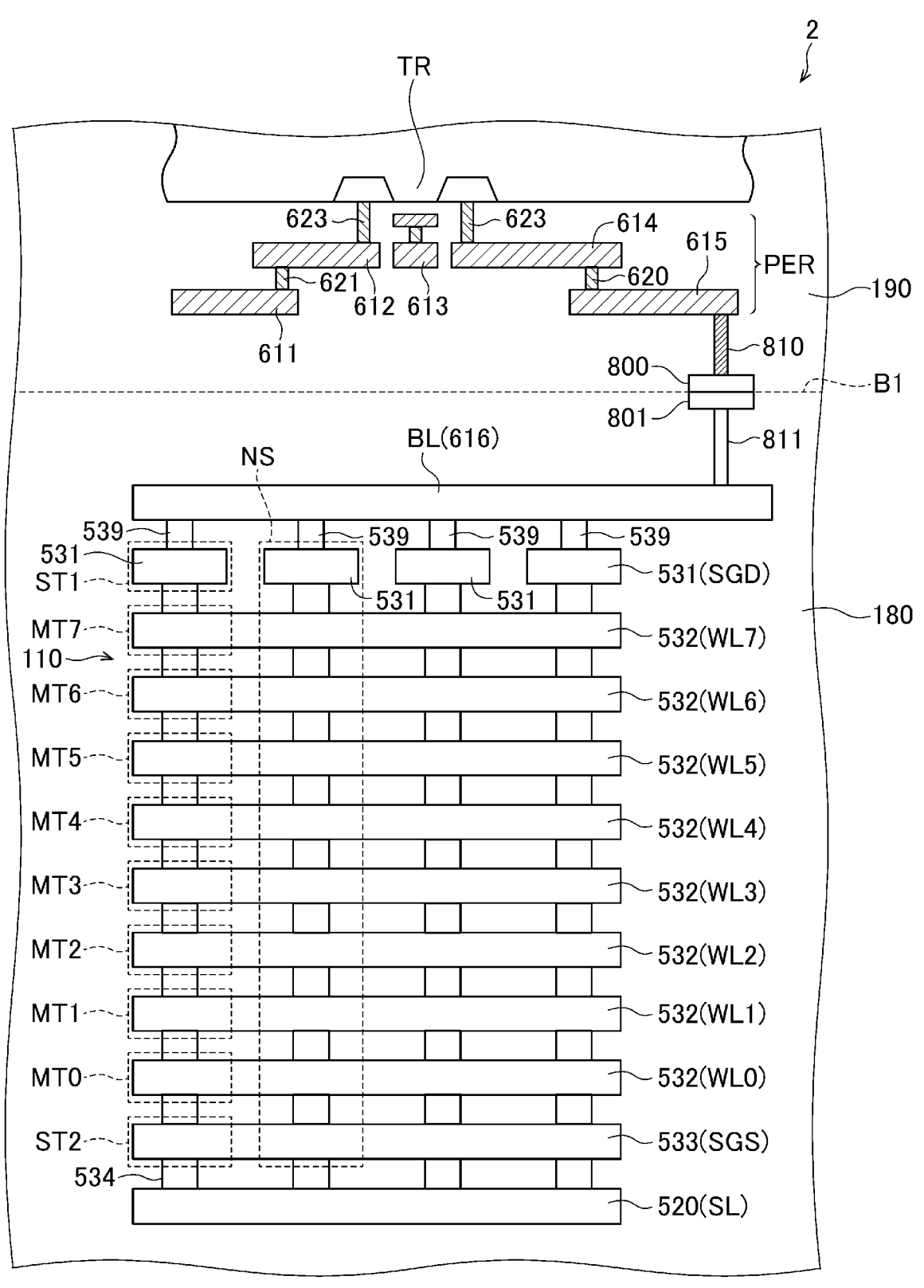
FIG. 17 is a cross-sectional diagram showing a cross-sectional structure of a semiconductor memory device of another embodiment.

The present disclosure is not limited to the above specific examples. For example, the semiconductor memory device 2 is not limited to the structure as shown in FIG. 5, and may have a CMOS directly bonded to array (CBA) structure as shown in FIG. 17. In the semiconductor memory device 2 shown in FIG. 17, the memory unit 180 in which the memory cell array 110 is provided and the control circuit unit 190 in which the peripheral circuit PER is provided are manufactured separately. The semiconductor memory device 2 is configured by bonding the separately manufactured memory unit 180 and the control circuit unit 190 to each other at the bonding surface B1. The bonding pad 800 of the control circuit unit 190 provided on the bonding surface B1 and the bonding pad 801 of the memory unit 180 are bonded to each other. The memory cell array 110 and the peripheral circuit PER are electrically connected to each other through the bonding pads 800 and 801 and the vias 810 and 811.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a memory cell array including a plurality of memory cell transistors; and
a sense amplifier provided between the memory cell array and an input/output circuit, wherein
the sense amplifier includes
a data latch circuit configured to operate at a first operating voltage and to latch data to be written to the memory cell transistors and data read from the memory cell transistors,
a multiplexer unit configured to operate at a second operating voltage different from the first operating voltage and provided between the input/output circuit and the data latch circuit,
a sense amplifier unit configured to latch data read from the memory cell transistors at a time of reading in the data latch circuit and to store the data latched in the data latch circuit in the memory cell transistors at a time of writing,
the data latch circuit includes
a first node connected to the multiplexer unit and in which a first voltage, which is supplied from the multiplexer unit via a signal line in accordance with data to be latched in the data latch circuit, is latched, and
a second node connected to the sense amplifier unit and in which a second voltage having a voltage level that is inverted from that of the first voltage, is latched, and
a high-level of the first voltage latched in the first node is at a voltage level of the second operating voltage at a time the first voltage is supplied from the multiplexer unit via the signal line and transitions to a voltage level of the first operating voltage thereafter.

2. The semiconductor memory device according to claim 1, wherein
the data latch circuit includes
a first power supply voltage node to which the first operating voltage is applied, and
a first transistor connected to the first power supply voltage node and the first node, the semiconductor memory device further includes a control circuit, and
the control circuit sets
the first transistor to be in an off state when the first voltage supplied from the multiplexer unit to the first node is latched in the first node, and
sets the first transistor to be in an on state after the first voltage is latched in the first node, so that the high-level of the first voltage latched in the first node transitions from the voltage level of the second operating voltage to the voltage level of the first operating voltage.

3. The semiconductor memory device according to claim 1, wherein
the data latch circuit includes
a first power supply voltage node to which the first operating voltage is applied, and
a first transistor connected to the first power supply voltage node and the first node, the semiconductor memory device further includes a control circuit, and
the control circuit applies a third operating voltage that is at an intermediate voltage level between the voltage level of the first operating voltage and a ground voltage level to a gate of the first transistor when the first voltage supplied from the multiplexer unit to the first node is latched in the first node, and maintains a state in which the third operating voltage is applied to the gate after the first voltage is latched in the first node, so that the high-level of the first voltage latched in the first node transitions from the voltage level of the second operating voltage to the voltage level of the first operating voltage.

4. The semiconductor memory device according to claim 1, wherein
the multiplexer unit includes
a P-channel type transistor and an N-channel type transistor connected in parallel,
a transfer gate between the signal line and the data latch circuit, and
a ground voltage setting circuit configured to set the signal line to a ground voltage when the semiconductor memory device is powered on.

5. The semiconductor memory device according to claim 4, wherein
the multiplexer unit includes
a second power supply voltage node to which the second operating voltage is applied from a voltage generation circuit,
a third power supply voltage node to which the ground voltage is applied,
a second transistor provided between the second power supply voltage node and the signal line and configured with one of the N-channel type transistor and the P-channel type transistor, and
a third transistor provided between the third power supply voltage node and the signal line and configured with the other of the N-channel type transistor and the P-channel type transistor, and the ground voltage setting circuit is configured to generate a signal capable of turning off the second transistor and turning on the third transistor to gates of the second transistor and the third transistor, so that the voltage of the signal line is set to the ground voltage when the semiconductor memory device is powered on.

6. The semiconductor memory device according to claim 5, wherein the ground voltage setting circuit includes:

an arithmetic circuit having a first input configured to receive a data signal from the input/output circuit and a second input configured to receive a control signal, and configured to generate the signal capable of turning off the second transistor and turning on the third transistor based on a level of the data signal and a level of the control signal.

7. The semiconductor memory device according to claim 6, wherein the arithmetic circuit is a NAND circuit and the control signal is inverted from an input control signal that is generated by a control circuit of the semiconductor memory device.

8. The semiconductor memory device according to claim 4, wherein the multiplexer unit includes a second power supply voltage node to which the second operating voltage is applied from the voltage generation circuit, a third power supply voltage node to which the ground voltage is applied, a second transistor provided between the second power supply voltage node and the signal line and config- ured with one of the N-channel type transistor and the P-channel type transistor, and a third transistor provided between the third power supply voltage node and the signal line and config- ured with the other of the N-channel type transistor and the P-channel type transistor, the ground voltage setting circuit includes a fourth transistor provided between the second power supply voltage node and the second transistor, and a fifth transistor provided between the third power supply voltage node and the signal line, and the ground voltage setting circuit is controlled to turn off the fourth transistor and turn on the fifth transistor, so that the signal line is set to the ground voltage when the semiconductor memory device is powered on.

9. The semiconductor memory device according to claim 1, further comprising:

a first chip including the memory cell array and a plurality of first bonding pads; and a second chip including the sense amplifier and a plurality of second bonding pads, wherein the first chip and the second chip are bonded together by bonding the first bonding pads to the second bonding pads.

10. The semiconductor memory device according to claim 1, wherein the first operating voltage is higher than the second operating voltage.

11. A method of operating a semiconductor memory device comprising a memory cell array including a plurality of memory cell transistors and a sense amplifier provided between the memory cell array and an input/output circuit, wherein the sense amplifier includes a data latch circuit configured to operate at a first operating voltage and to latch data to be written to the memory cell transistors and data read from the memory cell transistors, a multiplexer unit configured to operate at a second operating voltage different from the first operating voltage and provided between the input/output cir- cuit and the data latch circuit, a sense amplifier unit configured to latch data read from the memory cell transistors at a time of reading in the data latch circuit and to store the data latched in the data latch circuit in the memory cell transistors at a time of writing, and the method includes latching a first voltage, which is supplied from the multiplexer unit via a signal line in accordance with data to be latched in the data latch circuit, at a first node of the data latch circuit connected to the multiplexer unit;

latching a second voltage having a voltage level that is inverted from that of the first voltage in a second node connected to the sense amplifier unit; and transitioning a high-level of the first voltage latched in the first node, which is at a voltage level of the second operating voltage at a time the first voltage is supplied from the multiplexer unit via the signal line, to a voltage level of the first operating voltage thereafter.

12. The method according to claim 11, wherein the data latch circuit includes a first power supply voltage node to which the first operating voltage is applied, and a first transistor connected to the first power supply voltage node and the first node, and the method further includes setting the first transistor to be in an off state when the first voltage supplied from the multiplexer unit to the first node is latched in the first node, and setting the first transistor to be in an on state after the first voltage is latched in the first node, so that the high-level of the first voltage latched in the first node transitions from the voltage level of the second operating voltage to the voltage level of the first operating voltage.

13. The method according to claim 11, wherein the data latch circuit includes a first power supply voltage node to which the first operating voltage is applied, and a first transistor connected to the first power supply voltage node and the first node, the method further includes applying a third operating voltage that is at an inter- mediate voltage level between the voltage level of the first operating voltage and a ground voltage level to a gate of the first transistor when the first voltage supplied from the multiplexer unit to the first node is latched in the first node; and maintaining a state in which the third operating voltage is applied to the gate after the first voltage is latched in the first node, so that the high-level of the first voltage latched in the first node transitions from the voltage level of the second operating voltage to the voltage level of the first operating voltage.

14. The method according to claim 11, wherein the multiplexer unit includes a P-channel type transistor and an N-channel type transistor connected in parallel, and a transfer gate between the signal line and the data latch circuit, and the method further includes setting the signal line to a ground voltage when the semiconductor memory device is powered on.

15. The method according to claim 14, wherein the multiplexer unit includes a second power supply voltage node to which the second operating voltage is applied from a voltage generation circuit, a third power supply voltage node to which the ground voltage is applied, a second transistor provided between the second power supply voltage node and the signal line and configured with one of the N-channel type transistor and the P-channel type transistor, and a third transistor provided between the third power supply voltage node and the signal line and configured with the other of the N-channel type transistor and the P-channel type transistor, and the method further includes generating a signal capable of turning off the second transistor and turning on the third transistor to gates of the second transistor and the third transistor, so that the voltage of the signal line is set to the ground voltage when the semiconductor memory device is powered on.

16. The method according to claim 15, wherein the multiplexer unit includes an arithmetic circuit having a first input configured to receive a data signal from the input/output circuit and a second input configured to receive a control signal, and configured to generate the signal capable of turning off the second transistor and turning on the third transistor based on a level of the data signal and a level of the control signal.

17. The method according to claim 16, wherein the arithmetic circuit is a NAND circuit and the control signal is inverted from an input control signal that is generated by a control circuit of the semiconductor memory device.

18. The method according to claim 14, wherein the multiplexer unit includes a second power supply voltage node to which the second operating voltage is applied from the voltage generation circuit, a third power supply voltage node to which the ground voltage is applied, a second transistor provided between the second power supply voltage node and the signal line and configured with one of the N-channel type transistor and the P-channel type transistor, and a third transistor provided between the third power supply voltage node and the signal line and configured with the other of the N-channel type transistor and the P-channel type transistor, a fourth transistor provided between the second power supply voltage node and the second transistor, and a fifth transistor provided between the third power supply voltage node and the signal line, and the method further includes turning off the fourth transistor and turning on the fifth transistor when the semiconductor memory device is powered on, so that the signal line is set to the ground voltage.

19. The method according to claim 11, wherein the semiconductor memory device further comprises:

a first chip that includes the memory cell array and a plurality of first bonding pads; and a second chip that includes the sense amplifier and a plurality of second bonding pads, wherein the first chip and the second chip are bonded together by bonding the first bonding pads to the second bonding pads.

20. The method according to claim 11, wherein the first operating voltage is higher than the second operating voltage.

* * * * *